(12) United States Patent
Bufano et al.

(10) Patent No.: US 7,798,758 B2
(45) Date of Patent: *Sep. 21, 2010

(54) REDUCED CAPACITY CARRIER, TRANSPORT, LOAD PORT, BUFFER SYSTEM

(75) Inventors: Michael L. Bufano, Belmont, MA (US); Ulysses Gilchrist, Reading, MA (US); William Fosnight, Carlisle, MA (US); Christopher Hofmeister, Hampstead, NH (US); Daniel Babbs, Austin, TX (US); Robert C. May, Austin, TX (US)

(73) Assignee: Brooks Automation, Inc., Chelmsford, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/594,365

(22) Filed: Nov. 7, 2006

(65) Prior Publication Data

US 2007/0189880 A1   Aug. 16, 2007

Related U.S. Application Data

(63) Continuation of application No. 11/556,584, filed on Nov. 3, 2006, now abandoned.

(60) Provisional application No. 60/733,813, filed on Nov. 7, 2005.

(51) Int. Cl.
*B65H 1/00* (2006.01)

(52) U.S. Cl. .................... 414/222.01; 414/266

(58) Field of Classification Search ............... 198/447, 198/448, 575, 601; 414/940, 222.01, 222.07, 414/222.13, 261, 266
See application file for complete search history.

(56) References Cited

U.S. PATENT DOCUMENTS

| | | | | |
|---|---|---|---|---|
| 5,411,358 A | * | 5/1995 | Garric et al. | 414/277 |
| 5,417,537 A | * | 5/1995 | Miller | 414/217 |
| 5,980,183 A | * | 11/1999 | Fosnight | 414/222.01 |
| 6,026,561 A | * | 2/2000 | Lafond | 29/722 |
| 6,821,082 B2 | * | 11/2004 | McGowan | 414/805 |
| 6,990,721 B2 | * | 1/2006 | Mariano et al. | 29/469 |
| 7,101,138 B2 | * | 9/2006 | Fosnight et al. | 414/222.11 |
| 7,221,993 B2 | * | 5/2007 | Rice et al. | 700/112 |
| 7,281,623 B1 | * | 10/2007 | Kitazumi et al. | 198/799 |
| 2002/0094257 A1 | * | 7/2002 | Babbs et al. | 414/277 |
| 2004/0126208 A1 | | 7/2004 | Tawyer et al. | 414/222.02 |
| 2004/0151562 A1 | * | 8/2004 | Hofmeister et al. | 414/217 |
| 2004/0181929 A1 | * | 9/2004 | Mariano et al. | 29/469 |
| 2004/0191030 A1 | * | 9/2004 | Rice et al. | 414/222.01 |

* cited by examiner

*Primary Examiner*—Saúl J Rodríguez
*Assistant Examiner*—Joshua I Rudawitz
(74) *Attorney, Agent, or Firm*—Perman & Green, LLP; Richard Pickreign

(57) ABSTRACT

A semiconductor workpiece processing system having at least one processing apparatus for processing workpieces, a primary transport system, a secondary transport system and one or more interfaces between first transport system and second transport system. The primary and secondary transport systems each have one or more sections of substantially constant velocity and in queue sections communicating with the constant velocity sections.

8 Claims, 35 Drawing Sheets

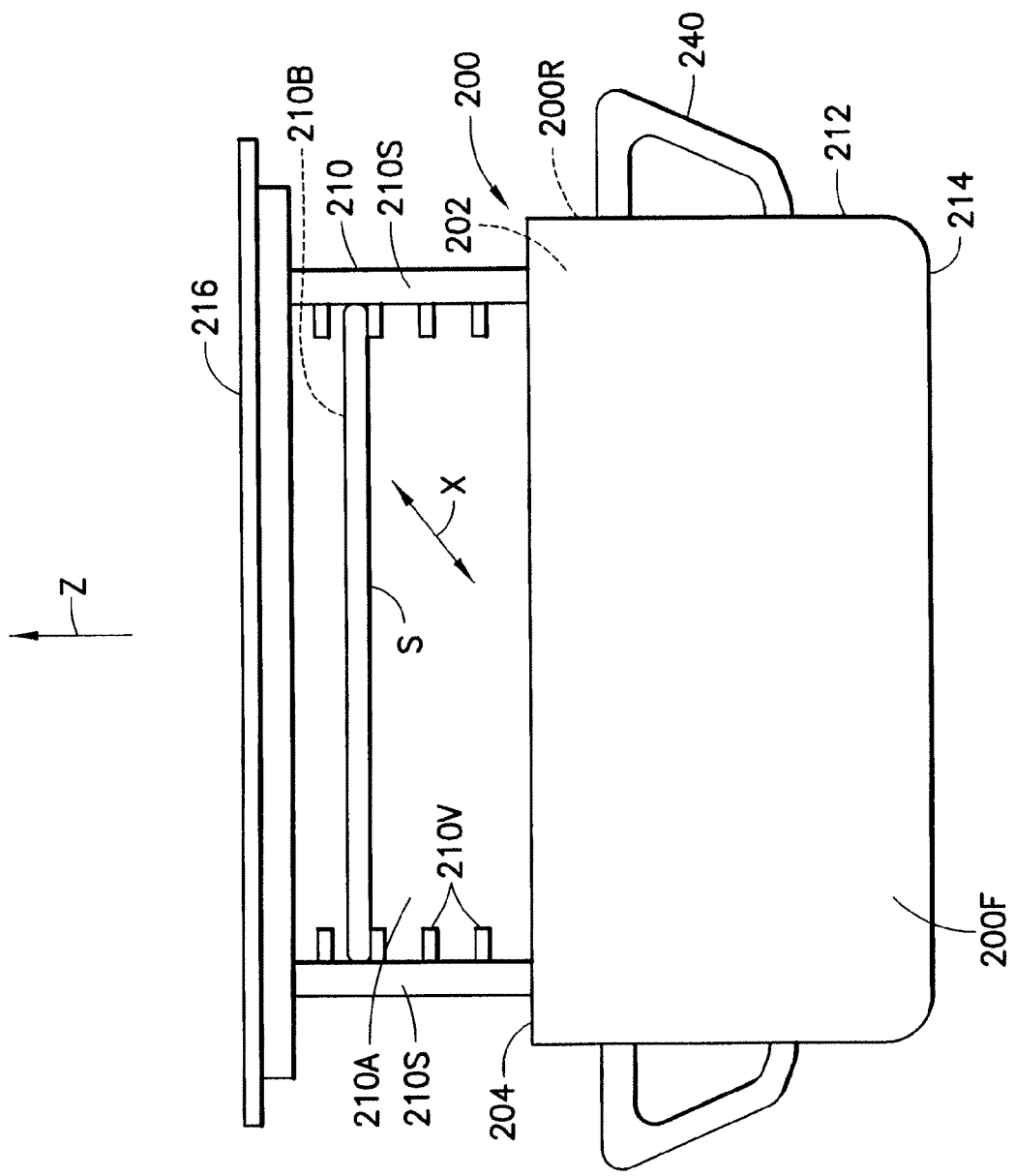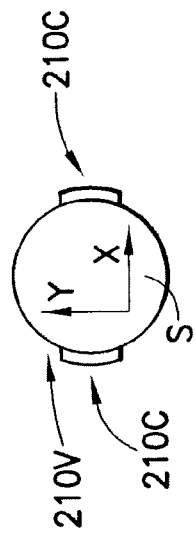

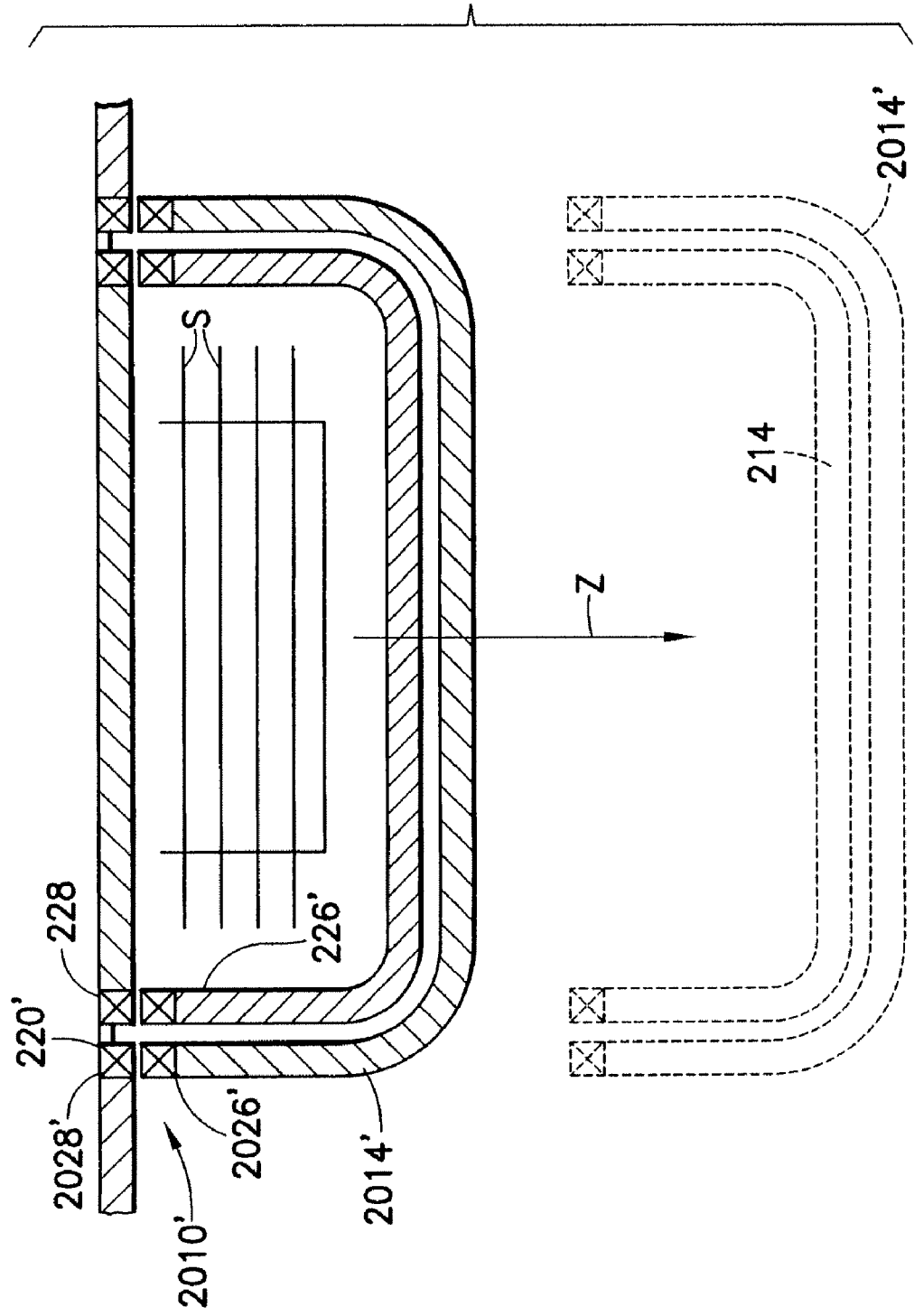

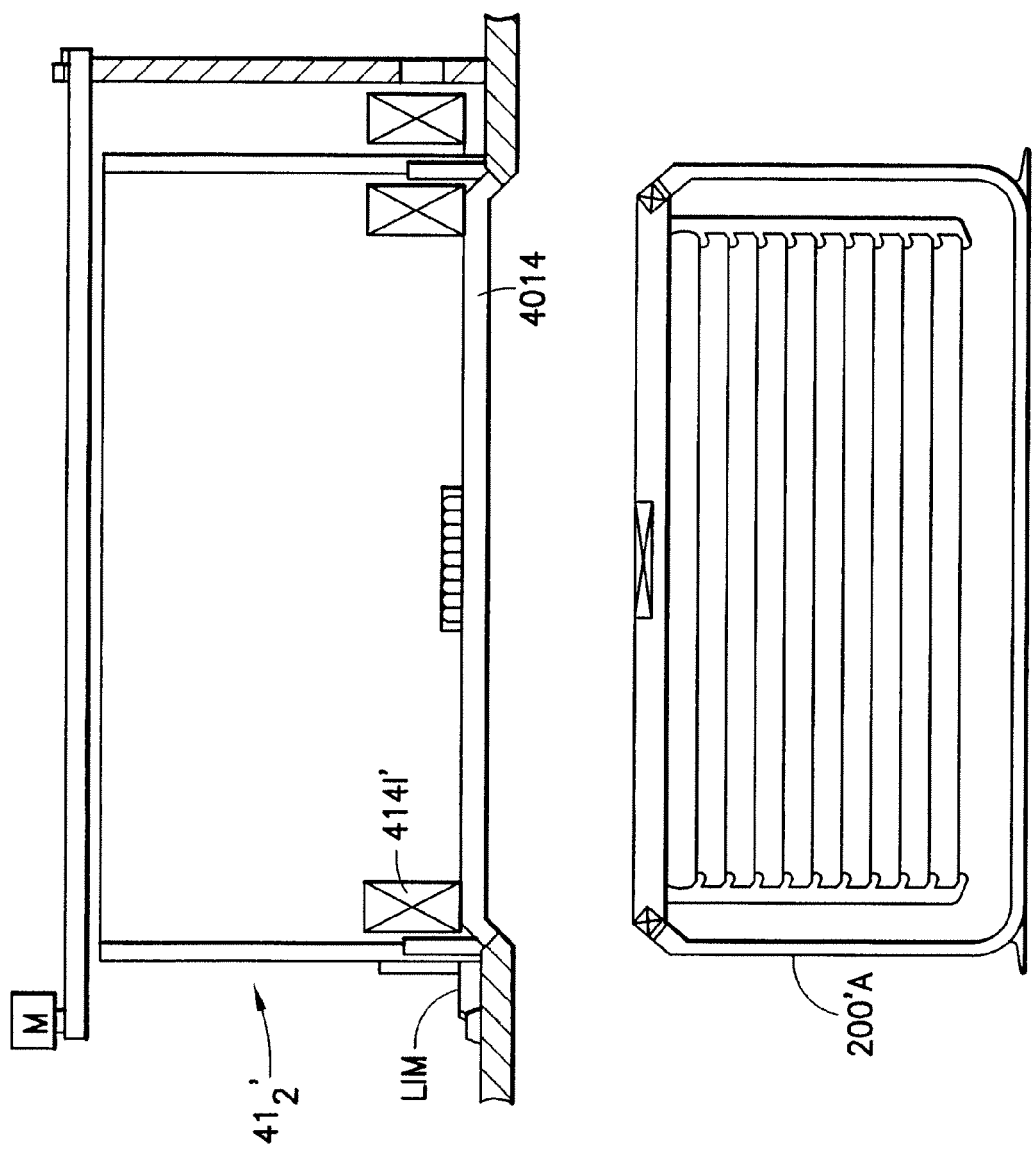

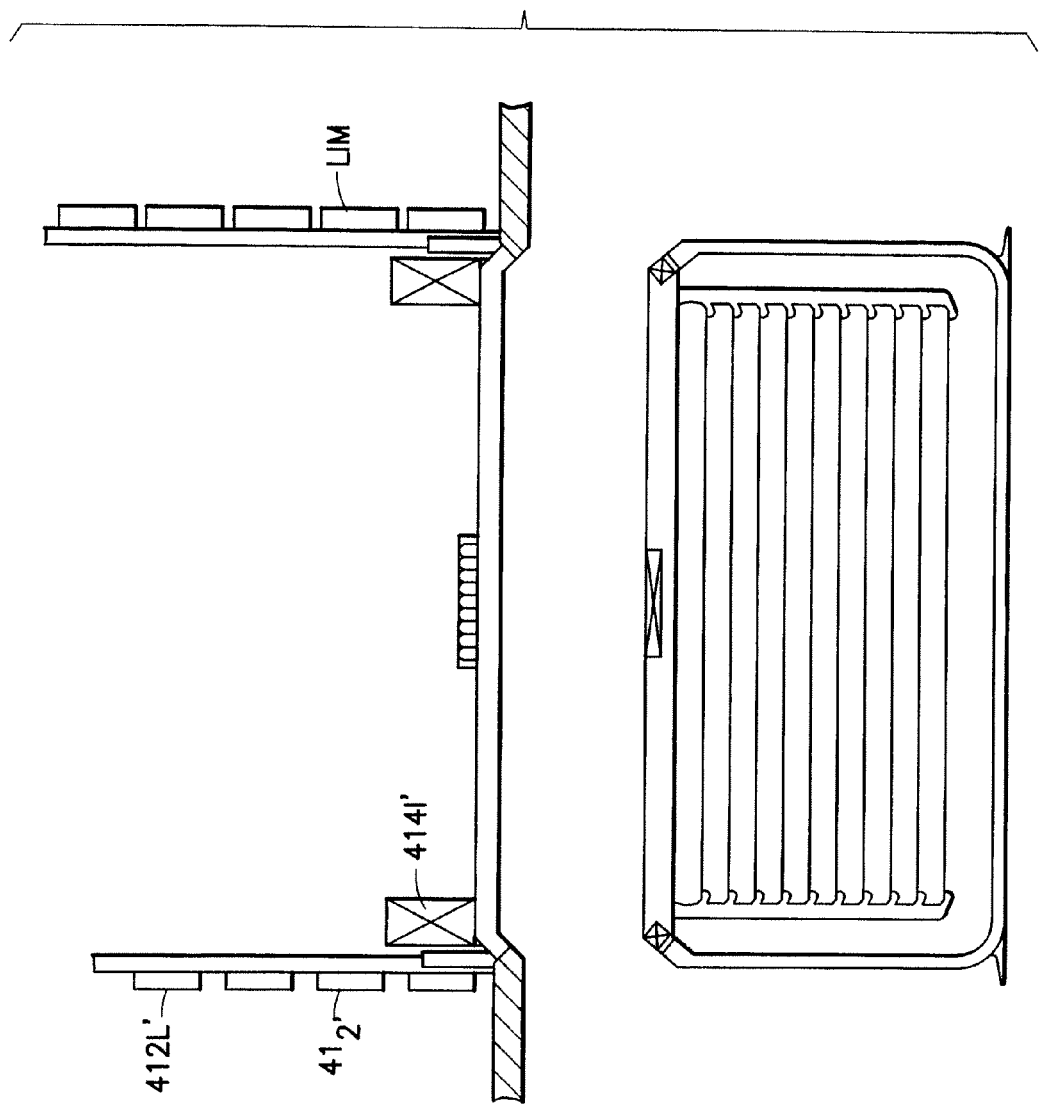

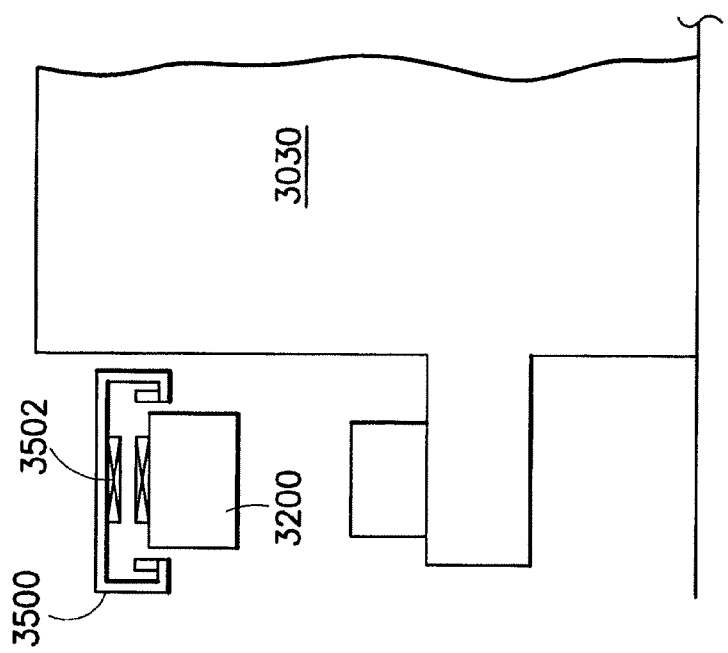
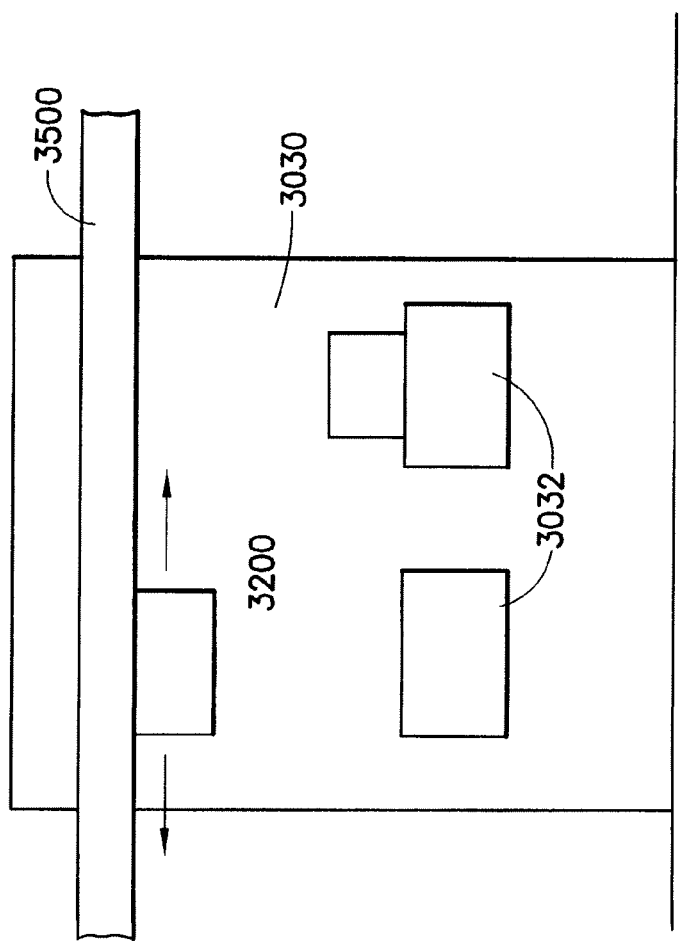
FIG. 25B
FIG. 25A

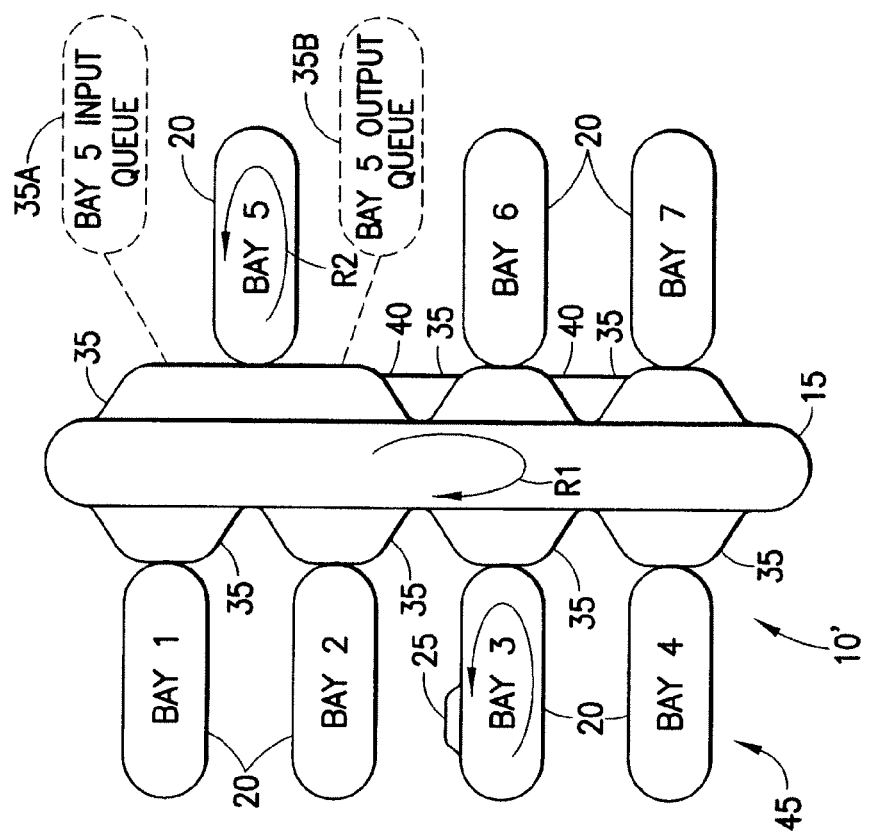
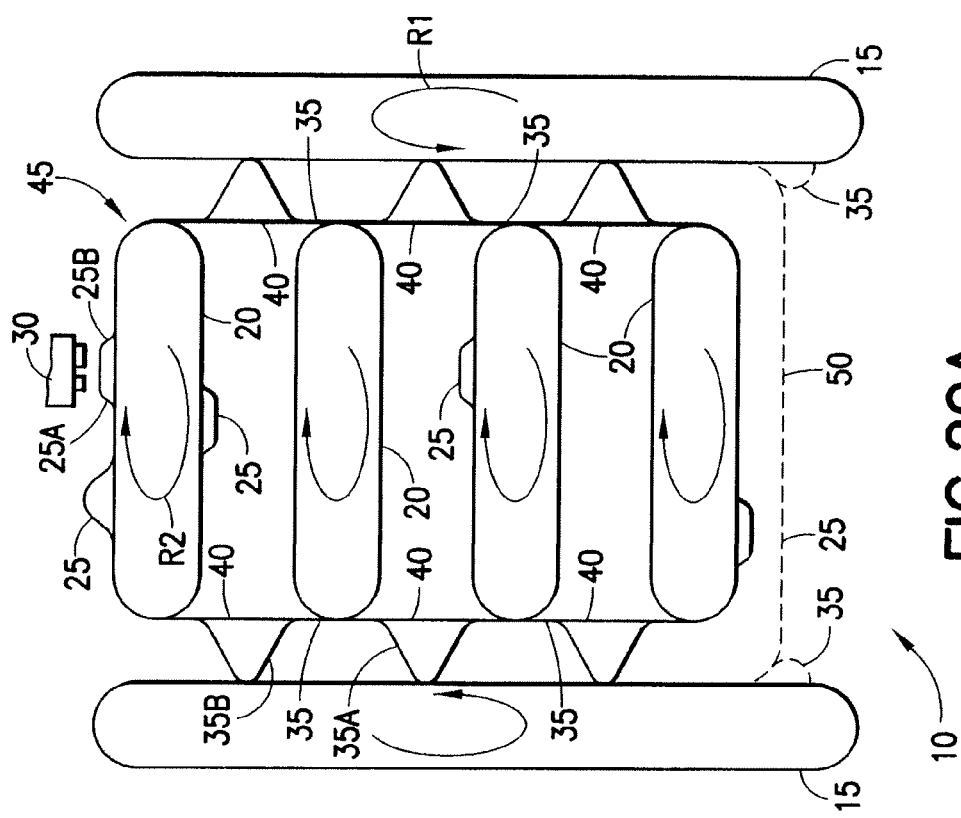
FIG. 29B
FIG. 29A

REDUCED CAPACITY CARRIER, TRANSPORT, LOAD PORT, BUFFER SYSTEM

CROSS-REFERENCE TO RELATED APPLICATION(S)

This application is a continuation of U.S. Ser. No. 11/556,584, filed Nov. 3, 2006 now abandoned which claims the benefit of U.S. Provisional Application No. 60/733,813 filed Nov. 7, 2005 which is incorporated by reference herein in its entirety.

FIELD

The exemplary embodiments described herein are related to substrate processing systems and particularly to substrate transport systems, transport carriers, transport to processing tool interfaces and arrangements.

EARLIER RELATED EMBODIMENTS

The prime forces on the fabrication of electronic devices are the consumer desire for more capable, and smaller electronic devices at lower costs. The primal forces translate to an impetus on manufacturers for further miniaturization and improvements in fabrication efficiency. Manufacturers, thus seek gains wherever possible. In the case of semiconductor devices, the conventional fabrication facility or FAB has at its heart (or base organizational structure) the discrete processing tool, for example a cluster tool, for performing one or more processes to semiconductor substrates. Conventional FABs are hence organized around the processing tool, that may be arranged in desired configurations to transform the semiconductor substrates into desired electronic devices. For example, the processing tool may be arrayed in the conventional FAB in processing bays. As may be realized, between tools, substrates may be held in carriers, such as SMF's, FOUP's, so that between tools substrates in process may remain in substantially similar cleanliness conditions as within the tools. Communication between tools may be provided by handling systems (such as automated material handling systems, AMHS) capable of transporting substrate carriers to the desired processing tools in the FAB. Interface between the handling system and processing tool may be considered for example purposes as having generally two parts, interface between handling system and tool to load/unload carriers to the loading stations of the processing tool, and interface of the carriers (i.e. individually or in groups) to the tool to allow loading and unloading or substrates between carrier and tool. There are numerous conventional interface systems known that interface the processing tools to carriers and to material handling systems. Many of the conventional interface systems suffer from complexity resulting in one or more of the process tool interface, the carrier interface or the material handling system interface having undesired features that increase costs, or otherwise introduce inefficiencies in the loading and unloading of substrates in processing tools. The exemplary embodiments described in greater detail below overcome the problems of conventional systems.

SUMMARY OF THE EXEMPLARY EMBODIMENT(S)

In accordance with an exemplary embodiment of a semiconductor workpiece processing system is provided. The system has at least one processing apparatus for processing workpieces, a primary transport system, a secondary transport system and one or more interfaces between first transport system and second transport system. The primary and secondary transport systems each have one or more sections of substantially constant velocity and in queue sections communicating with the constant velocity sections.

BRIEF DESCRIPTION OF DRAWINGS

The foregoing aspects and other features of the present invention are explained in the following description, taken in connection with the accompanying drawings, wherein:

FIG. 1 is a schematic elevation view of a workpiece carrier incorporating features in accordance with an exemplary embodiment, and a workpiece or substrate S positioned on the carrier; and FIGS. 1A-1B are respectively schematic partial plan and elevation views of a workpiece support of the carrier in accordance with another exemplary embodiment.

FIG. 2B is another schematic cross-section elevation of a tool port interface and carrier in accordance with another exemplary embodiment;

FIG. 10A is a schematic partial elevation of a process tool and carrier interfaced therewith in accordance with another exemplary embodiment;

FIGS. 18-19 are schematic elevation views of a tool interface and carrier in accordance with another exemplary embodiment;

FIGS. 25A-25B respectively show different elevation views of a transport system and processing tool in accordance with another exemplary embodiment;

FIGS. 29A-29B are schematic plan views of transport systems in accordance with another exemplary embodiment;

DESCRIPTION OF THE EMBODIMENT(S)

Figure 2A:
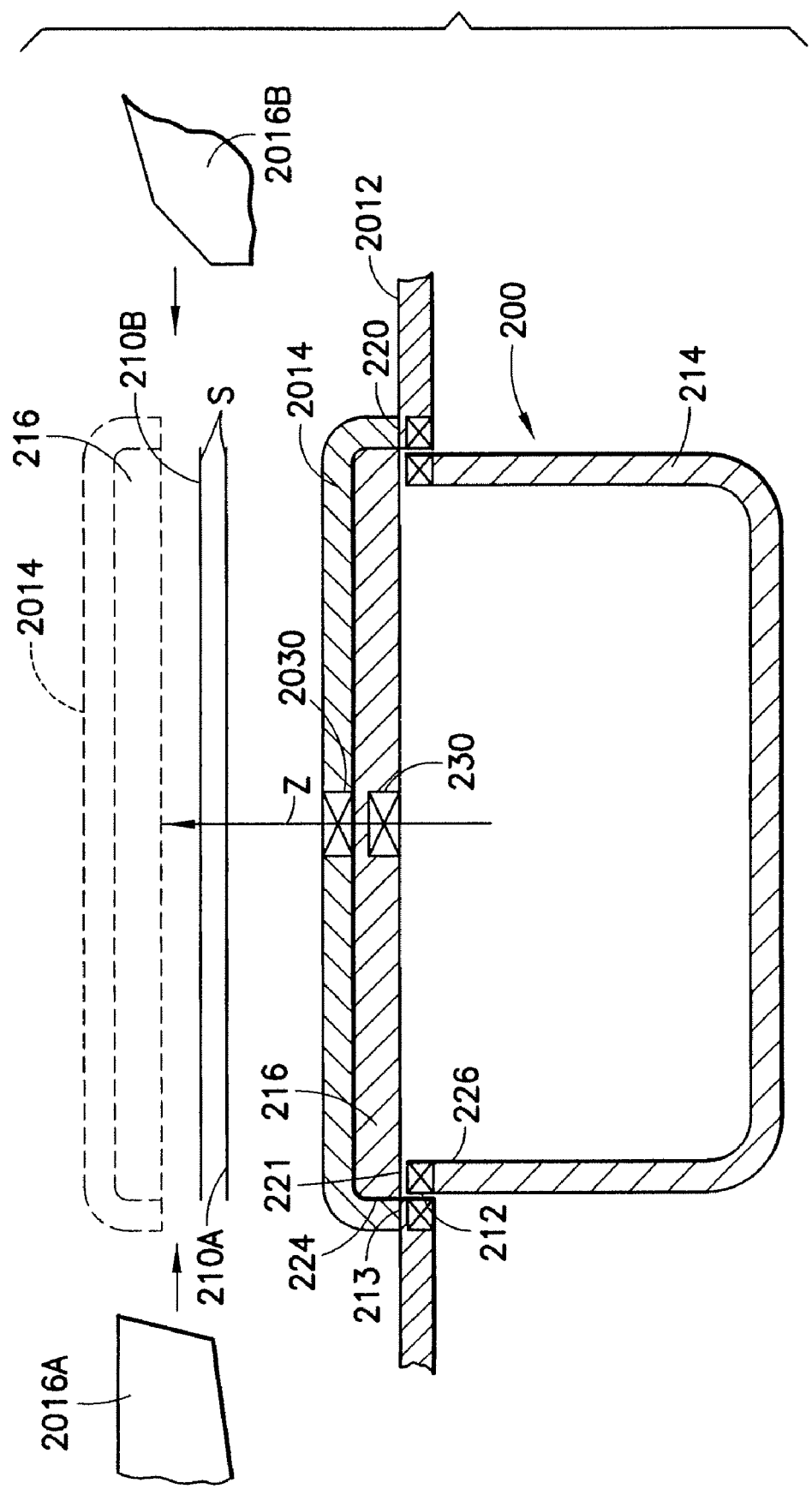
FIG. 2A is a schematic cross-sectional elevation view of the carrier in FIG. 1 and a tool port interface in accordance with another exemplary embodiment.

Still referring to FIG. 1, the workpiece carrier 200 defines a chamber 202 in which workpieces S may be carried in an environment capable of being isolated from the atmosphere exterior to the chamber. The shape of the carrier 200 shown in FIG. 1 is merely exemplary, and in alternate embodiments the carrier may have any other desired shape. The carrier 200 may be capable of accommodating a cassette 210 inside the chamber for supporting the workpieces S within the carrier as shown. The cassette 210 generally has elongated supports 210S (in the embodiment two are shown for example) with workpiece support shelves 210V distributed thereon to provide a row or stack of supports, or shelves on which one or more workpieces may be individually supported as shown. The cassette may be mounted or otherwise attached to the carrier structure, and will be described in greater detail below. In alternate embodiments, the carrier may not have a cassette, and the workpiece supports may be integral or formed as a unitary construction with the carrier structure. The workpieces are shown as flat/substrate elements, such as 350 mm, 300 mm, 200 mm or any desired size and shape semiconductor wafers, or reticles/masks or flat panels for displays or any other suitable items. The carrier may be a reduced or small lot size carrier, relative to conventional 13 or 25 wafer carriers. The carrier may be configured to carry a small lot with as few as one workpiece, or may be configured to carry small lots of less than ten workpieces. Suitable examples of reduced capacity carriers, similar to carrier 200, are described and shown in U.S. patent application Ser. No. 11/207,231, filed Aug. 19, 2005, titled "Reduced Capacity Carrier and Method of Use', incorporated by reference herein in its entirety. Suitable examples of interfaces between the carrier, similar to carrier 200, and processing tools (e.g. semiconductor fabrication tools, stockers, sorters, etc.), and transport systems are described and shown in U.S. patent application Ser. No. 11/210,918, filed Aug. 23, 2005, titled "Elevator Bases Tool Loading and Buffering System"; and Ser. No. 11/211,236, filed Aug. 24, 2005, titled "Transportation System", both of which are incorporated by reference herein in their entirety. Another suitable example of a carrier, with features similar to carrier 200, is described and shown in U.S. application Ser. No. 10/697,528, filed Oct. 30, 2003, titled "Automated Material Handling System" and also incorporated by reference herein in its entirety. As may be realized, a reduced size carrier, similar to carrier 200, allows reduction of work in process in the FAB as the workpieces forming smaller lots may be immediately (upon completion of processing at a given workstation) transported to following workstations in the FAB without waiting for completion of processing of other workpieces as would occur in larger lots. Though the features of the exemplary embodiments are described and shown with specific reference to small capacity carriers, the features of the exemplary embodiments apply equally to any other suitable carrier, such as carriers capable of housing 13, or 25, or any other desired number of workpieces therein.

Referring still to FIG. 1, in the exemplary embodiment, carrier 200 may be shaped to hold the workpieces in a vertical (i.e. Z axis) stack. Carrier 200 may be a bottom or top opening or bottom and top opening carrier. In the exemplary embodiment shown, top and bottom are disposed along the vertical or Z axis, though in alternate embodiments top and bottom may be oriented along any other axis. Top and bottom openings, which will be described in greater detail below, means that the opening(s) 204 of the carrier (though which workpieces S moved in and out of the chamber 202, defined by the carrier) are substantially aligned with the planar surface of the workpieces held in the carrier (in this embodiment substantially orthogonal to Z axis). Carrier 200 as will also be seen below, generally has a casing 212 with a base and a closable or removable door. When closed, the door may be locked and sealed to the base. The seal between door and base may allow the chamber 202 to be isolated from the exterior atmosphere. The isolated chamber 202 may hold any desired isolated atmosphere, such as clean air, an inert gas, or may be capable of holding a vacuum. The door may be opened to allow workpieces to be loaded/unloaded from the carrier. In the exemplary embodiment, door means a removable or removed portion when the carrier is opened to access the workpieces/workpiece support shelves therein. In the exemplary embodiment shown in FIG. 1, casing 200 generally has a generally recessed or hollow portion (referred to hereafter as the shell) 214 capable of receiving the workpieces therein, and a wall (cap/cover, etc.) 216. As will be described below, either wall 216, or shell 214 may operate as the carrier door. The wall and shell are mated to close the carrier, and are separated to open the carrier. In the exemplary embodiment, the shell and wall may be metal, such as an aluminum alloy, or stainless steel made by any suitable process. The wall or shell or both may be one piece members (unitary construction). In alternate embodiments, the carrier casing may be made of any other suitable materials including suitable non metallic materials. Cassette 210 may be mounted to the wall 216, though in alternate embodiments the cassette may be mounted to the shell. Mounting of the cassette to either the shell or door may be selected to facilitate ease of removal of the cassette, or substrates therein from the carrier when the door is opened. Though in the embodiment shown wall 216 is located on top of the shell, in alternate embodiments the carrier casing may have a configuration with the shell on top and wall on the bottom. In still other embodiments, the shell may have a removable wall both on top and bottom (i.e. carrier with top and bottom openings). In other alternate embodiments, the removable wall may be located on a lateral side of the carrier. In the exemplary embodiment, the door may be a passive component (for example, substantially without moving parts or components to effect closing and opening between door and carrier and between door and tool interface as will be described further below).

Referring now to FIG. 2A, carrier 200 is shown positioned at a tool port interface 2010 of a suitable processing tool. The processing tool may be of any desired type, for example a sorter, stocker, or a tool capable of one or more processes, such as material deposition, lithography, masking, etching, polishing, metrology, or a tool with one or more process modules or chambers such as a load lock. The processing tool may have a controlled atmosphere, at least in part, and the tool interface 2010 allows loading/unloading of workpieces between tool and carrier 200 without compromising the controlled atmosphere in tool or carrier 200. In the exemplary embodiment, the port interface 2010 may generally have a port or opening 2012, through which substrates may be loaded into the processing tool, and a door, cover or removable portion 2014 closing the port. In alternate embodiments the removable portion may block the opening in part. In FIG. 2A, the port door 2014 is shown in closed and open positions for example purposes. In the embodiment shown in FIG. 2A, the carrier 200 may be bottom loaded (i.e. moved in Z direction) to interface with the tool port 2012 as will be described below. FIG. 2A shows top wall 216 operating as the door for carrier 200. For example, wall 216 may be connected to the port door 2014 and removed in unison with removal of the port door, for example into the tool, to open the tool port interface. Removal of the wall 216, causes removal of the cassette (mounted thereon) and workpieces thereon from the carrier (for access by a workpiece transport/robot). Referring again to FIG. 1, the configuration of cassette 210 with opposing supports 210S, provide access areas 210A, 210B on more than one side of the cassette (in the exemplary embodiment two sides) which workpiece robot(s) (see also FIG. 2A) may load/unload workpieces onto the cassette shelves. In alternate embodiments the carrier may have any desired number of workpiece access areas. The access areas may be arranged symmetrically around the perimeter of the carrier, or may be disposed in an asymmetric configuration. In the exemplary embodiment shown in FIG. 2A, the tool may have more than one workpiece handling robot 2016A, 2016B to access for example the workpieces V in the more than one access areas 210A, 210B. In alternate embodiments, the tool may have more or fewer workpiece transport robots. Multiside robot access to the cassette may allow workpiece hand off between robots at the cassette. Also, multisided robot access to workpieces delimits the orientation of the carrier when transported or interfaced to tool port. Accordingly, the carrier 200 may be mated to the tool interface in more than one orientation relative to the tool interface. The carrier is closed by returning the port door to its closed position which returns the carrier wall 216 to mate with shell 214.

Referring to FIG. 2B, there is shown the interface of carrier 200 with a tool port interface 2010' in accordance with another exemplary embodiment. In this embodiment, the shell 214 of the carrier may operate as the door. In the embodiment shown the tool port door 2014' may have a shape generally conformal to the carrier shell, to surround and seal around the shell in order to prevent exposure inside the tool interior to contamination on the outside of the shell. In the exemplary embodiment, the carrier 200 may be top loaded, (i.e. moved down along (−) Z direction) such as when the carrier is being lowered from an overhead transport system. To open the carrier 200, the port door is moved down (direction (−)Z), for example into the tool interior, simultaneously removing the shell 214 from the carrier. This may be referred to as bottom opening the carrier, in that the carrier door here (i.e. shell 214) is located on the bottom and opens the carrier by downward movement. The opening of the carrier, exposes the workpieces in the cassette, which remain with wall 216. In this embodiment, the robot (similar to robot(s) 2016A, 2016B in FIG. 2A) may be provided with degree of freedom in Z axis to access the vertically spaced cassette shelves or workpieces therein. The robot may have a mapper (not shown) thereon. In alternate embodiments, the shell 216 may have an integral mapper, such as a through beam mapper allowing mapping of the cassette on removal of the shell. FIGS. 2A-2B illustrate that carrier 200 may be both top and bottom opening. In other alternate embodiments, the shell and wall orientation may be reversed (shell on top of wall) and the carrier may be top opening in a similar but mirror image to FIG. 2B (i.e. lifting shell up) and bottom opening in a manner similar but opposite to FIG. 2A (i.e. lowering wall down).

Referring again to FIG. 1, as noted before the wall 216 and shell 214 may be passive structures, without movable elements, such as locks, which have the potential for generating contamination by actuation within the tool or container clean space. For example, the wall and shell may be magnetically locked to each other. Magnetic locks for example, may have permanent or electromagnetic elements 226, 228 or a combination thereof may be positioned as desired in wall 216 and shell 214 to lock and release wall and shell. The magnetic locks may for example have a reversible magnetic element that is switched (i.e. to open or close) by passing a charge through the reversible element. For example, the wall 216 may include magnetic elements 228 (for example ferrous material) and the shell 214 may have a magnetic switch elements 226 actuated to lock and unlock the wall and shell. In the exemplary embodiment shown in FIGS. 2A, 2B, the magnetic elements in the wall, and the operable magnets in the shell may be configured to allow cooperation with magnetic locks 2028', 2026' in the port door interface 2010, 2010' so that locking the carrier door (either wall or shell, see FIGS. 2A-2B) to the port door causes unlocking of the carrier door from the rest of the carrier. In alternate embodiments, the magnetic locks between wall and shell may have any other desired configuration. In the exemplary embodiment shown in FIG. 23 the carrier may include mechanical coupling elements 230, such as actuated pins, piezo coupling devices or shape memory devices to engage mating coupling features 2030 on the port interface and interlock the carrier to the port interface. In the exemplary embodiment, the devices are shown located in the wall portion, but in alternate embodiments the devices may be locked in the shell. As may be realized from FIG. 24, the actuable devices are enclosed in the sealed interface between the removable wall portion and port door trapping potential particulates, that may arise by operation of the devices therein. The passive carrier and carrier door provide a clean, washable carrier that is vacuum compatible.

As noted before, the carrier door and base (i.e. wall 216 and shell 224) may be sealed to isolate the carrier chamber 202. Also, when the carrier is interfaced with the port of a tool, (for example a load port module), the carrier door and base may each have sealing interfaces for respectively sealing the carrier door (i.e. wall 216 or shell 214 in FIG. 1) to the port door and the carrier base to the port. Further, the port door may have a seal interface to the port.

Figure 3A:
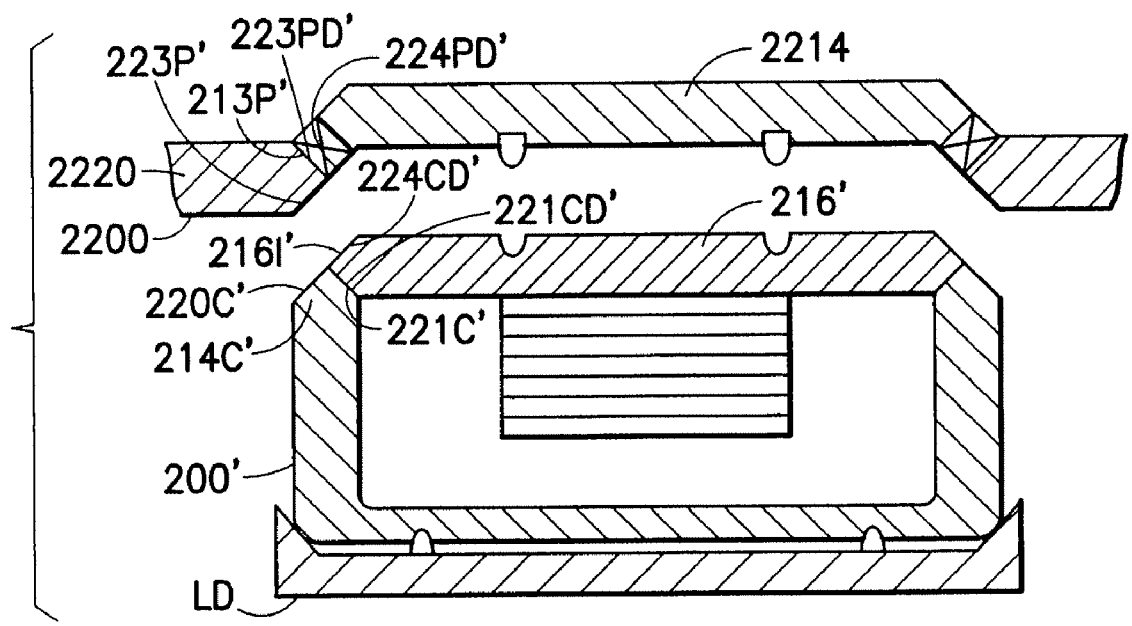
FIGS. 3A-3C are schematic cross-section elevation views respectively illustrating a tool port interface and carrier, in accordance with another exemplary embodiment, in three different positions.
Figure 3B:
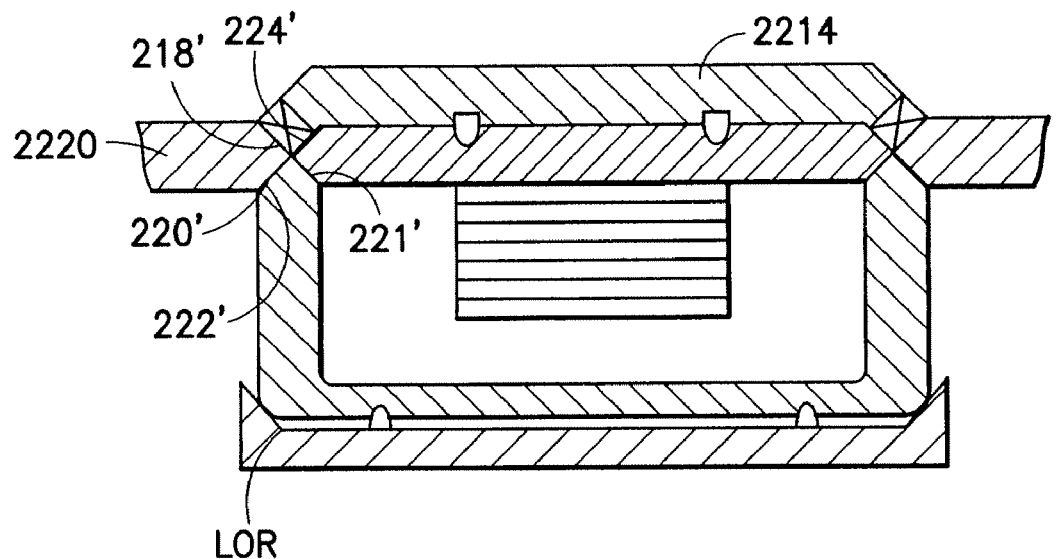
Figure 3C:
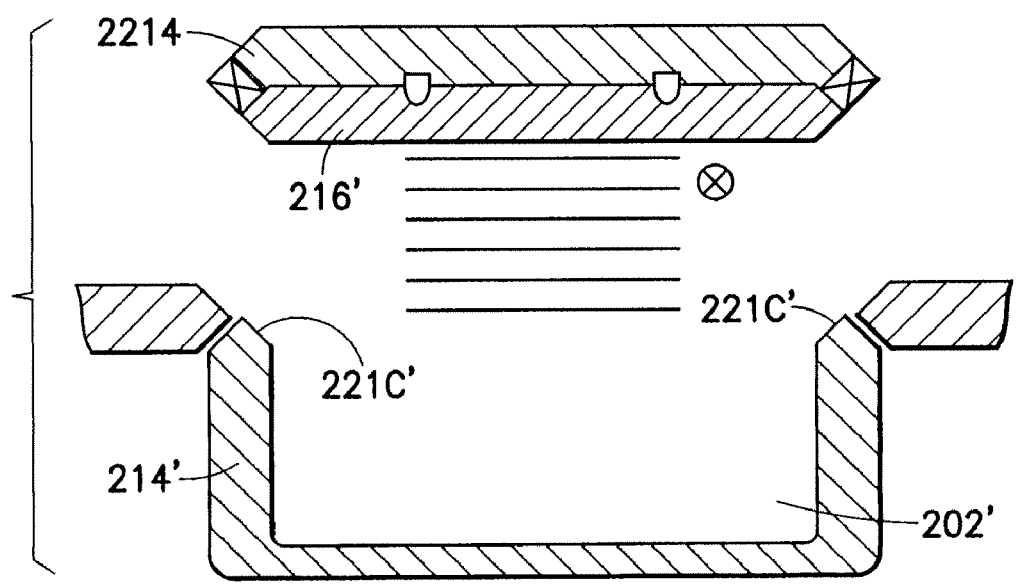

FIGS. 3A-3C show a carrier 200', similar to carrier 200, being interfaced to tool port 2220 in accordance with an exemplary embodiment where the respective seal interfaces (221' carrier door to carrier, 222' carrier to port, 223' port door to port and 224' port door to carrier door) form a combined seal 222' with what may be referred to for convenience as a general X configuration (seen best in FIG. 3B). In the exemplary embodiment shown, the carrier seal interfaces are shown at the top opening for example purposes, and in alternate embodiments wherein the carrier has multiple openings (similar to opening 204 shown in FIG. 1, (e.g. top and bottom) sealing interfaces may be provided at each opening. As may be realized, the general x configuration is merely a schematic representation of the sealing interface surface and in alternate embodiments the sealing interface surfaces may have any suitable arrangement, for example the seal interface surfaces may be curved. The generally X shaped seal configuration defines multiple seal interfaces (e.g. 221'-222') with substantially zero (0) trapped volume between the interfaces. Hence, opening of any sealed interface will not result in a release of contaminants into the space opened on opening of the seal interface. Moreover, in other alternate embodiments the seal may have any desired orientation (e.g. the seal interfaces being oriented horizontally or vertically in a general + pattern). In the exemplary embodiment, the carrier 200' is illustrated as a top opening (wall 216' is door opened by lifting upwards similar to the embodiment illustrated in FIG. 2A) and the port 2220 is configured for bottom loading (lifter lifts carrier 220' upwards to dock to tool port) for example purposes. The shell 214' in this embodiment may have a sealing interface 214I' generally beveled sealing faces 221C', 222C'. Though the sealing faces 222C', 221C' on the shell are shown substantially flat, in alternate embodiments the sealing faces may have inclusive or exclusive angles or other shapes formed therein for enhanced sealing though the surface is generally pitched to result in the generally X shape seal configuration. The wall 216' of the carrier in this embodiment has sealing interface 216I' oriented (in the exemplary embodiment shown in FIG. 3A, beveled) generally to define sealing faces 221CD' and 224CD'. As seen in FIG. 3A, the respective shell and wall sealing faces 221C', 221CD' are generally complementary defining seal interface 221' when wall and shell are closed. The faces 221C' on the carrier interface 214' form a general wedge providing a guide for the wall 216' when being seated onto the shell (see for example FIG. 3C). Also, in the exemplary embodiment the carrier door to carrier seal interface 221' may be positioned so that the weight of the wall 216' acts to increase sealing pressure on the interface. As may be realized, the cassette and workpieces supported from the wall 216' in this embodiment aid in sealing the carrier door to carrier. As seen in FIGS. 3A-3B, sealing faces 222C' and 224CD' are disposed to complement the sealing faces 222P', 224PD' respectively on the port 2220 and port door 2214. FIG. 3B shows the carrier 200' docked to the port 2220, and seals 221', 224' closed. Closure of seals 222', 224' seals off and isolates all exposed surfaces (i.e. surfaces exterior of controlled or isolated chambers inside the carrier or tool) with potential contamination from the interior/chambers of the tool and carrier. As seen best in FIG. 3B, the generally x shape seal 220' provides for optimal cleanliness as it forms what may be referred to as a substantially zero lost volume interface. This as noted before means that the seal geometry of seal 220' does not generate substantial pockets or spaces having exterior surfaces that are exposed (i.e. become interior surfaces) when either the carrier door or the port door is opened. This is best seen in FIG. 3C, wherein removal of the port door 2214, thereby removing the carrier door 216' does not cause exposure of any previously unsealed/exterior surfaces to the carrier/process tool interiors.

As seen in FIG. 3C, top opening of the carrier door results, in this embodiment, in the carrier chamber 202' being located under the raised cassette supported from the wall 216'. The carrier chamber 202' is in communication with the tool interior, that may have a forced air circulation system (not shown), which may cause a general venturi flow within the carrier chamber. In this embodiment, the circulatory air flow within the carrier chamber is located below the workpieces on the raised cassette (hanging from wall 216') with minimum potential for deposition of particulates disturbed by the circulation (which settle down away from the workpieces above). In the exemplary embodiment shown in FIGS. 3A-3C, the carrier 200' may be raised, to interface with and dock with the port 2220 by a suitable lifting device LD. Suitable registration features LDR may be provided on carrier and lifting device to position the carrier on the device and hence position the carrier relative to the port. In alternate embodiments the carrier may be held at the port in any suitable manner. The carrier door 216' may be locked to the port door 2214 via a magnetic lock, mechanical interlocks (e.g. positioned in the sealed interface between doors) or vacuum suction generated in the sealed interface between doors. The port door 2214 may be opened/closed by a suitable device that may be capable of indexing the cassette (similar to cassette 210 in FIG. 1) past a desired mapping sensor (not shown).

Figure 4:
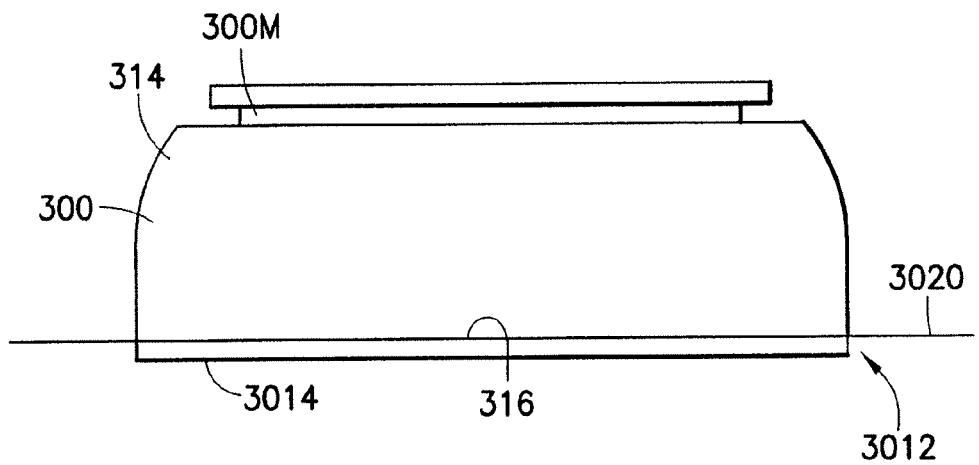
FIG. 4 is a schematic elevation view of a carrier and tool interface in accordance with yet another exemplary embodiment.
Figure 4A:
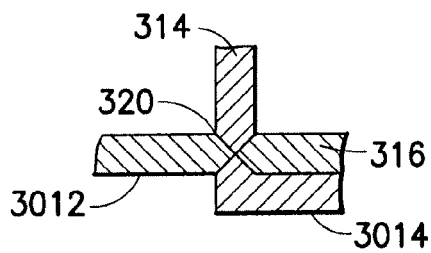
FIGS. 4A-4C are respectively enlarged cross-sectional views of a portion of the interface between carrier and tool each illustrating the interface configuration in accordance with different exemplary embodiments.

Referring now to FIG. 4, there is shown a carrier 300 in accordance with another exemplary embodiment, Carrier 300 is generally similar but inverse to carrier 200 with the shell 314 on top of wall 316. Similar to carrier 200, carrier 300 may be either top (shell operates as door) or bottom (wall operates as door) opening. In the exemplary embodiment shown, the carrier 300 may have integral transport components 300M. For example, the carrier shell (or wall) 314, 316 may have transport motive supports such as rollers or air bearings and a reactive member capable of being motivated by a drive or motor to cause the carrier to be self transportable (i.e. without using an independent transport vehicle) within the FAB. FIG. 4 illustrates the carrier 300 positioned at a loading port 3010 (generally similar to port 2010 described before) for example purposes. In the exemplary embodiment shown, the carrier 300 may be top loaded onto the port interface. The carrier door 316 may be positioned against or adjacent (to form an interface with) the port door 3014, and the shell 314 may interface the port 3012. Carrier 300 and port interface may also have a three, four or five way "cross" type (or zero lost volume) seal similar to the general X seal 220' shown in FIG. 3B. FIG. 4A shows a cross sectional view of the seal 320 in accordance with one embodiment. In the exemplary embodiment seal 320 may be a four way seal for a bottom opening configuration but otherwise generally similar to seal 220'.

Figure 4B:
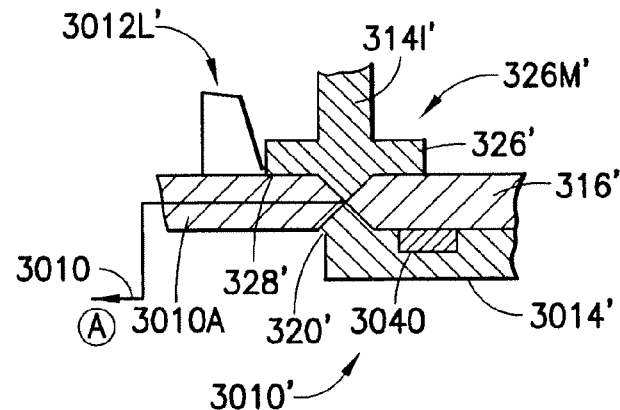
Figure 4C:
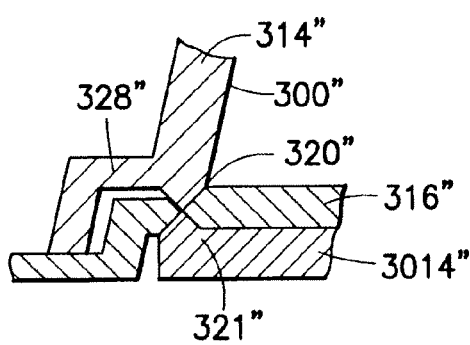

FIG. 4B shows another cross-section of the interface between carrier and port, and the seal therebetween in accordance with another exemplary embodiment. In this embodiment, seal 320' is substantially similar to seal 320. FIG. 4B further shows that the shell interface 314I' may have supporting flanges/features 326', 328'. Flange 326' in this embodiment may operate wall 316', for example the flange may overlap a portion of the carrier door (though in the embodiment shown the feature defines a door contact surface, in alternate embodiments, the feature may not contact the door) and locate a magnetic lock 326M' to hold the wall 316' to shell 314' when the carrier door is closed. Further, feature 326' may overlap magnetic lock 3040' in the port door 3014. The magnetic lock 3040' in the port door may operate for locking the wall 316' to the port door 3014' for carrier door removal. The position of the carrier shell feature 326' may enable the activation of the port door lock 3040' (locking wall 316' to the port door) and for example cause substantially simultaneous unlocking/deactivation of the wall 316' to shell 314' lock. Conversely, upon closing of the port door 3014', unlocking/deactivation of the port door lock 3040' may cause the magnetic latch 326M' between wall 316' and shell 314' to lock. In the exemplary embodiment, exterior feature 328' on the shell may engage a locating/centering feature 3012C' of the port 3010' to locate the carrier when seated. The shape of exterior feature 328' illustrated in FIG. 4B is merely exemplary, and in alternate embodiments the carrier may have any desired locating features. As noted before, the X configuration of seal 320' may eliminate purging the seal interface prior to opening the carrier door because the seal interface may have substantially zero purge volume. In alternate embodiments, (see for example FIG. 4B), the port may include a purge line 3010A. The purge line 3010A may be on any of the seal interfaces or between them. FIG. 4C shows another cross section of the carrier to tool port interface in accordance with another exemplary embodiment. The carrier to port interface has seal 320" generally similar to seal 320 described before. In this embodiment, the carrier shell 314" may have a support 328" for seating the carrier 300" on the port without loading the port door 3014" (i.e. supporting the carrier 300" on the port without distributing carrier weight onto the port door 3014") with the carrier door (wall) 316". Sealing contact at port door to carrier door seal 321" remains substantially constant when opening and closing the carrier door.

Figure 5A:
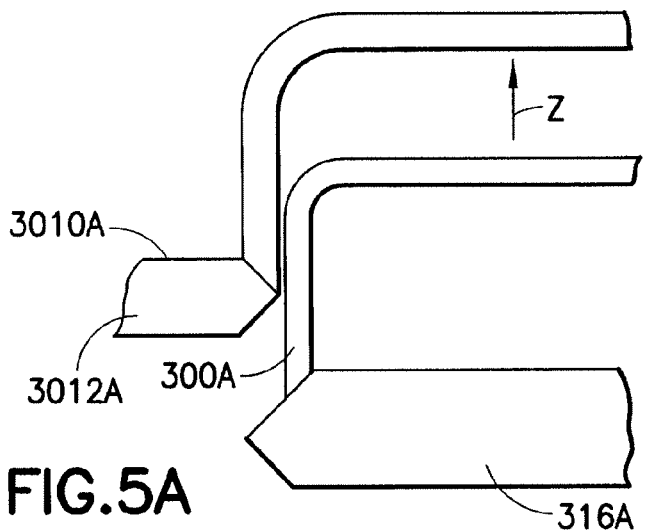
FIGS. 5A-5C are schematic partial elevation views of a carrier and tool interface in accordance with yet another exemplary embodiment, showing the carrier and tool interface in three respective positions.
Figure 5B:
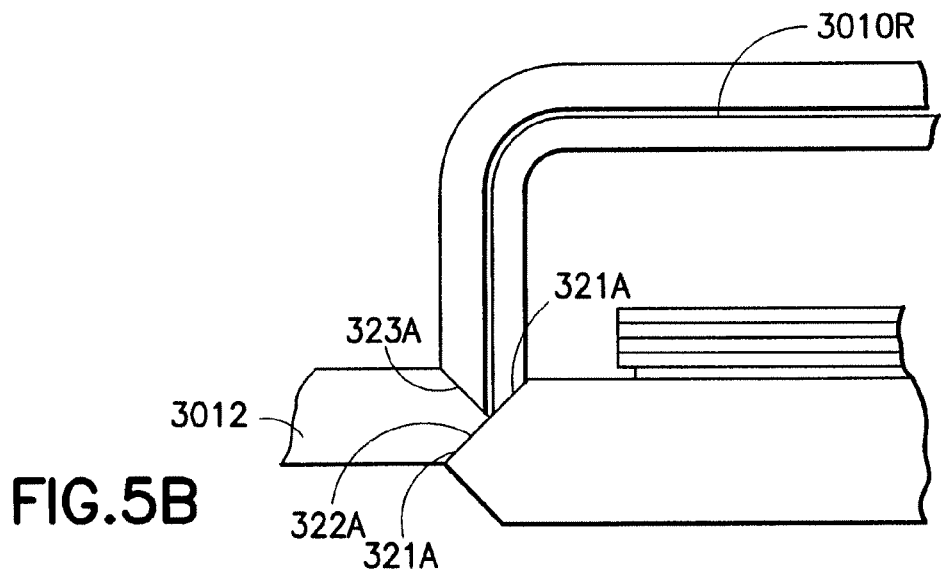
Figure 5C:
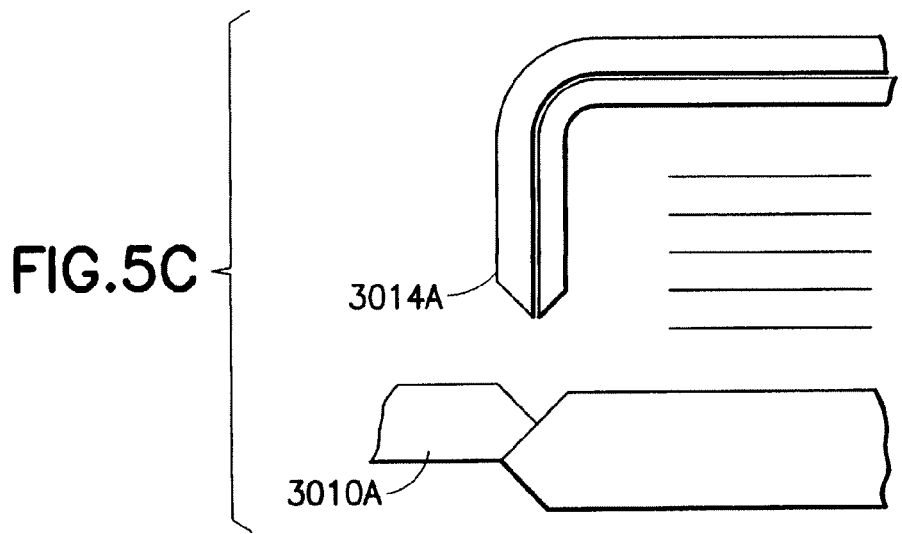

FIGS. 5A-5C illustrate a carrier 300A, similar to carrier 300, mated to a tool port in accordance with another exemplary embodiment. Carrier 300A in this embodiment may be top opening and bottom loaded (in the direction indicated by arrow +z in FIG. 5A). Carrier shell 316A may operate as the carrier door. The seal interface 320A, seen best in FIG. 5B is what may be referred to as a three way seal (with substantially zero purge or lost volume, similar to seal 320, 220 described before), with a general Y configuration (interface 321A, wall to shell, interface 322A wall to port, interface 323A port 3012A to port door 3014A). In this embodiment, the port door 3014A may be generally conformal to the shell 316A. For example, shell 316A may be nested in the port door 3014A. In the exemplary embodiment, the fit and placement of the shell 316A and port door 3014A minimizes the volume at the interface in between. A seal (not shown) may be provided between shell 316A and port door to seal the interface therebetween. As seen in FIG. 5B, the port door, 3014A in this embodiment, may have a vacuum port 3010V to purge the port door to carrier door interface volume.

Referring again to FIGS. 2A-2B, the carrier to port interface is shown according to still other exemplary configurations. Interface 220, 220' is substantially similar in the exemplary embodiments shown in FIGS. 2A, 2B (bottom load/top opening, top load/bottom opening respectively). Seal interface 220, 220' may be a four way seal with a general "cross" or X configuration (interface 221 wall 216 to shell 214, interface 222 shell 214 to port, interface 223 port 2012 to port door 2014 and interface 224 port door to wall 216). As seen in FIG. 2A, in this embodiment seal interfaces 222, 224 may be positioned (e.g. vertically) substantially parallel to direction of relative motion of interfacing surfaces (such as during loading of the carrier, and during closing of the port door). In other words, movement of the carrier or carrier door to closed position does not generate sealing closure. In this embodiment, one or more of the faces forming seal interfaces 222, 224, for example, may be provided with actuable seals such as inflatable seal, piezo actuated seal or shape memory members to actuate the seal sections and close the seal interface without substantial rubbing contact at the seal interface. The seal configurations described are merely exemplary.

Figure 6A:
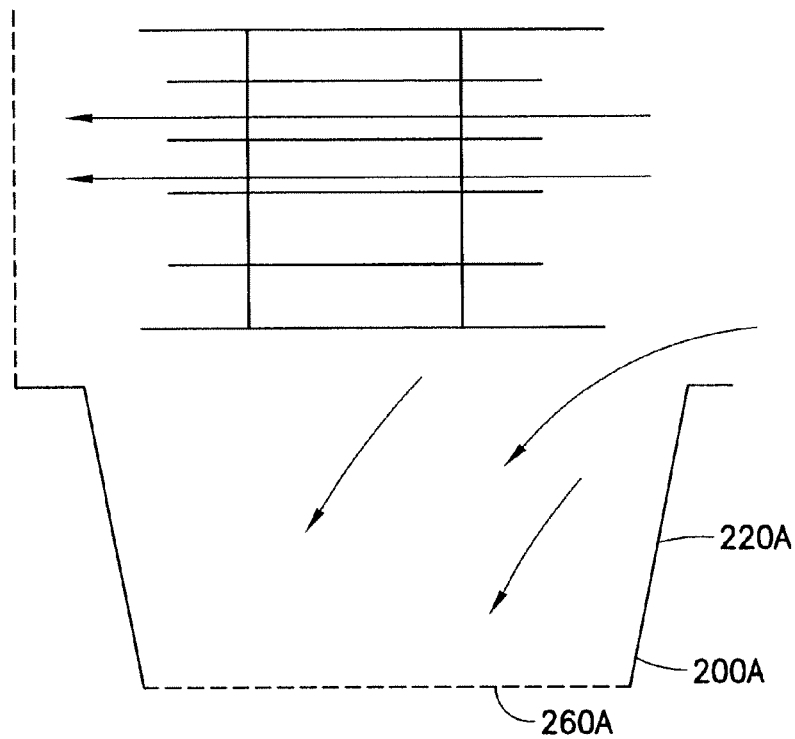
FIG. 6A-6B are respectively schematic elevation views of workpiece carriers in accordance with other different exemplary embodiments.
Figure 6B:
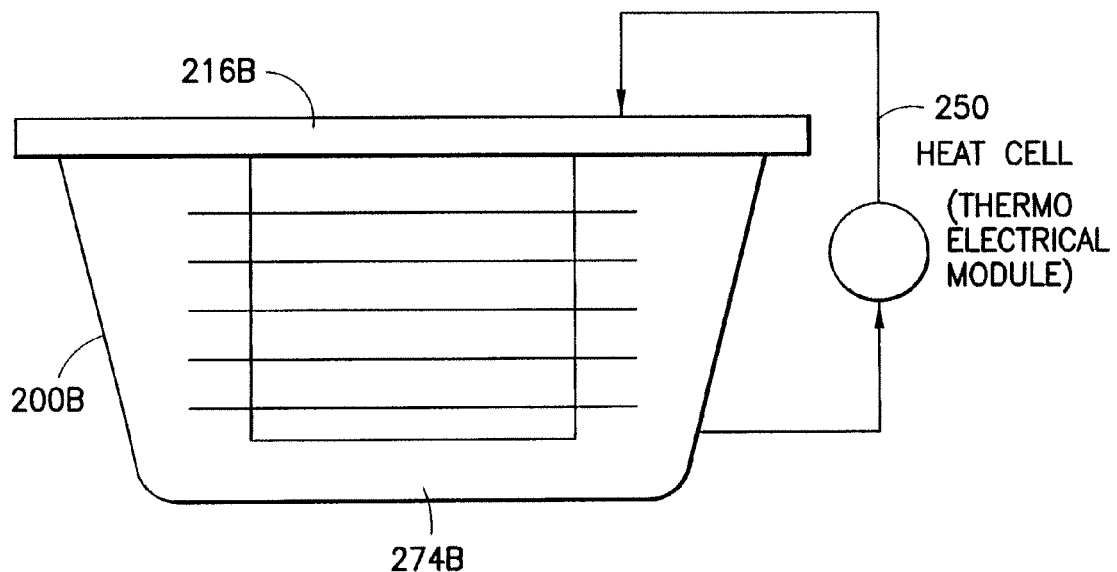

Referring again to FIG. 1, carrier shell 214 may have external supports 240 for handling the carrier. Supports 240 are shown, for example as handles, but may have any suitable form. In the exemplary embodiment, supports 240 may be located on opposite side of the shell as far apart as desired to optimize handling stability of the carrier. In alternate embodiments more or fewer supports may be provided. Referring now to FIG. 6A, carrier shell 220A may have a perforated or recessed member, membrane or filter 260A located proximate the bottom of the shell. The perforations or recesses in the member are sized and shaped to mitigate or reduce the strength of venturi or vortex flows induced in the shell when the carrier door is open. In alternate embodiments the venturi or vortex flow mitigation elements may be located in any other suitable location in the carrier. Carrier 200A is shown with the shell on bottom for example purposes, and in alternate embodiments the carrier may be on top. Further flow straightening spaces and/or vanes (not shown) may be provided within the tool interior to aid maintaining substantially smooth/laminar flow over the workpieces when positioned inside the tool. FIG. 6B shows a carrier 200B in accordance with another exemplary embodiment. The carrier 200B may have a thermal regulator 250 for maintaining the workpieces within the chamber at a different temperature then ambient temperature. For example, the carrier shell or wall 214B, 216B may have a thermoelectric module connected thermally to the workpieces, such as via the cassette supports, to heat/raise the temperature of the workpieces over ambient. Higher workpiece temperature than ambient drives particles and water molecules away from the workpiece via thermophoresis, preventing contamination when workpieces are out of carrier, or the carrier door is opened. In alternate embodiments, any other desired thermal regulator may be used such as microwave energy. In other alternate embodiments, an electrostatic field may be generated around each workpiece to repel contamination by water molecules and particulates.

Referring now to FIGS. 1A-1B, in the exemplary embodiment the cassette 210 (see also FIG. 1) may have nested shelves 210V for 360° positive restraint of the workpiece supported by the shelf. Each shelf 210V may be formed by one or more shelf seats or supports 210C. As seen in FIG. 1A, in the exemplary embodiment the cassette shelf supports 210C may be located so that the workpiece is generally straddled by the supports. Each shelf 210V may have a raised surface to form a perimeter constraint for the workpiece S seated on the shelf. The raised surface may be inclined (relative to the vertical) to form a locating guide 210L for seating the workpiece S. The seating surface of the shelf 210V may be pitched (relative to the bottom surface of the workpiece, forming for example a pitch angle of about 1° to the workpiece bottom surface) to ensure contact with the bottom of the workpiece for example within the perimeter exclusion zone. In alternate embodiments, the workpiece shelves may have any suitable configuration defining passive workpiece restraints. In other alternate embodiments, the shelves may not have passive workpiece restraints.

Figure 7A:
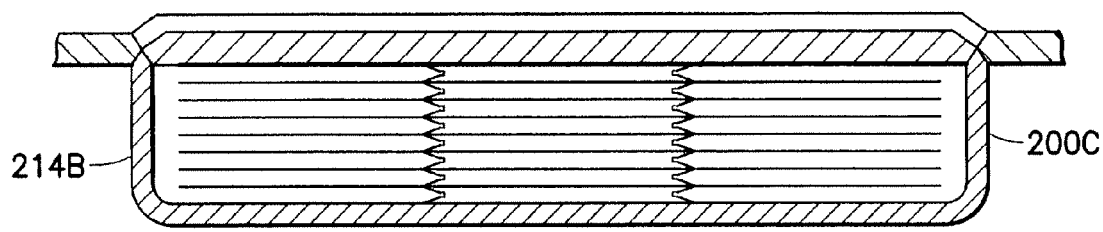
FIGS. 7A-7C are schematic elevation views of a workpiece carrier, in accordance with another exemplary embodiment, respectively showing the carrier in different positions.
Figure 7B:
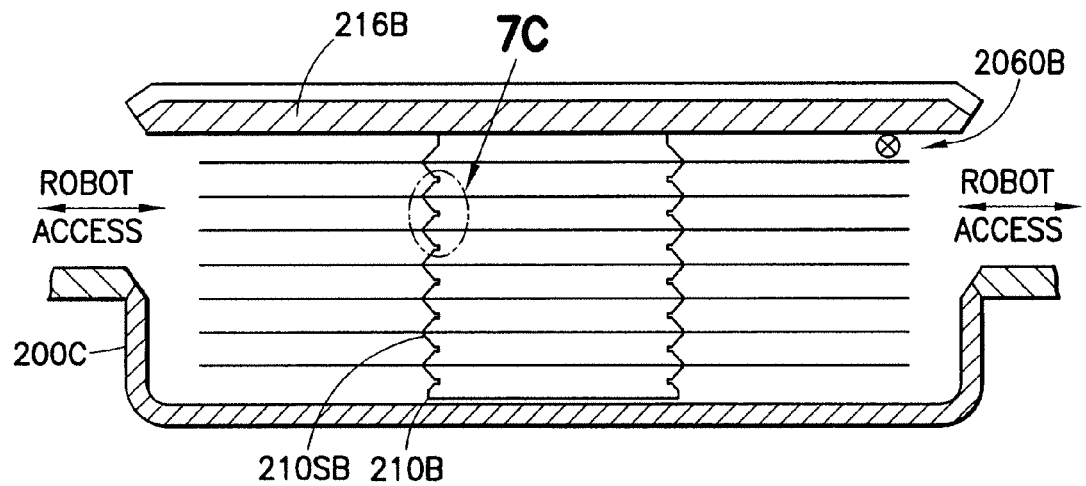
Figure 7C:
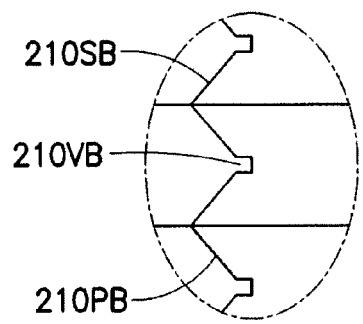

Referring now to FIGS. 7A-7B, the carrier 200C, in accordance with another exemplary embodiment which is similar to carrier 200 shown in FIG. 1, is shown respectively in closed and opened positions. Cassette 210B in this embodiment is capable of variable height. When the carrier 200B is closed, cassette 210B may be at a min height, and when the carrier door (e.g. wall 216B) is opened, the cassette may be expanded to a maximum height. The pitch between workpiece/shelves of the cassette is increased when cassette expands from min to max height thereby allowing min carrier height, with maximum space between workpieces when accessed. In this embodiment, the cassette supports 210SB may have a general bellows configuration. The supports may be made for example of aluminum sheet, or any other suitable material (e.g. shape memory material), allowing sufficient flexibility without articulated joints. As shown, the cassette supports may be supported at the top to the carrier wall 216B. Top opening of the carrier (removing wall 216B as shown in FIG. 7B) or bottom opening (removing shell 214B similar to that shown in FIG. 2B) causes the cassette (bellows) supports 210SB to expand under gravity. The cassette bellows is compressed by closing the carrier door. As seen in FIG. 7C, the bellows 210SB may have workpiece supports 210VB on which the workpieces rest. In the exemplary embodiment, the workpiece supports 210VB may be shaped, relative to adjoining portions 210PB of the bellows, to remain in a substantially constant radial position (hence avoiding relative radial movement between workpiece and workpiece seat) when the bellows expands/collapses. As may be realized, the bellows cassette may be collapsed so that the workpieces in the cassette are actively clamped between adjacent pleat section 210PB of the bellows. As may be realized, the upper clamping portions may contact workpiece along its peripheral edge. As seen in FIG. 7B, in the exemplary embodiment a through beam mapper 2060B, or other suitable device in the tool or carrier may be provided to determine the locations of the workpieces S when the cassette is expanded. The workpiece robot (not shown) may also have a sensor for detecting proximity of workpiece to ensure proper positioning for workpiece pick.

Figure 8:
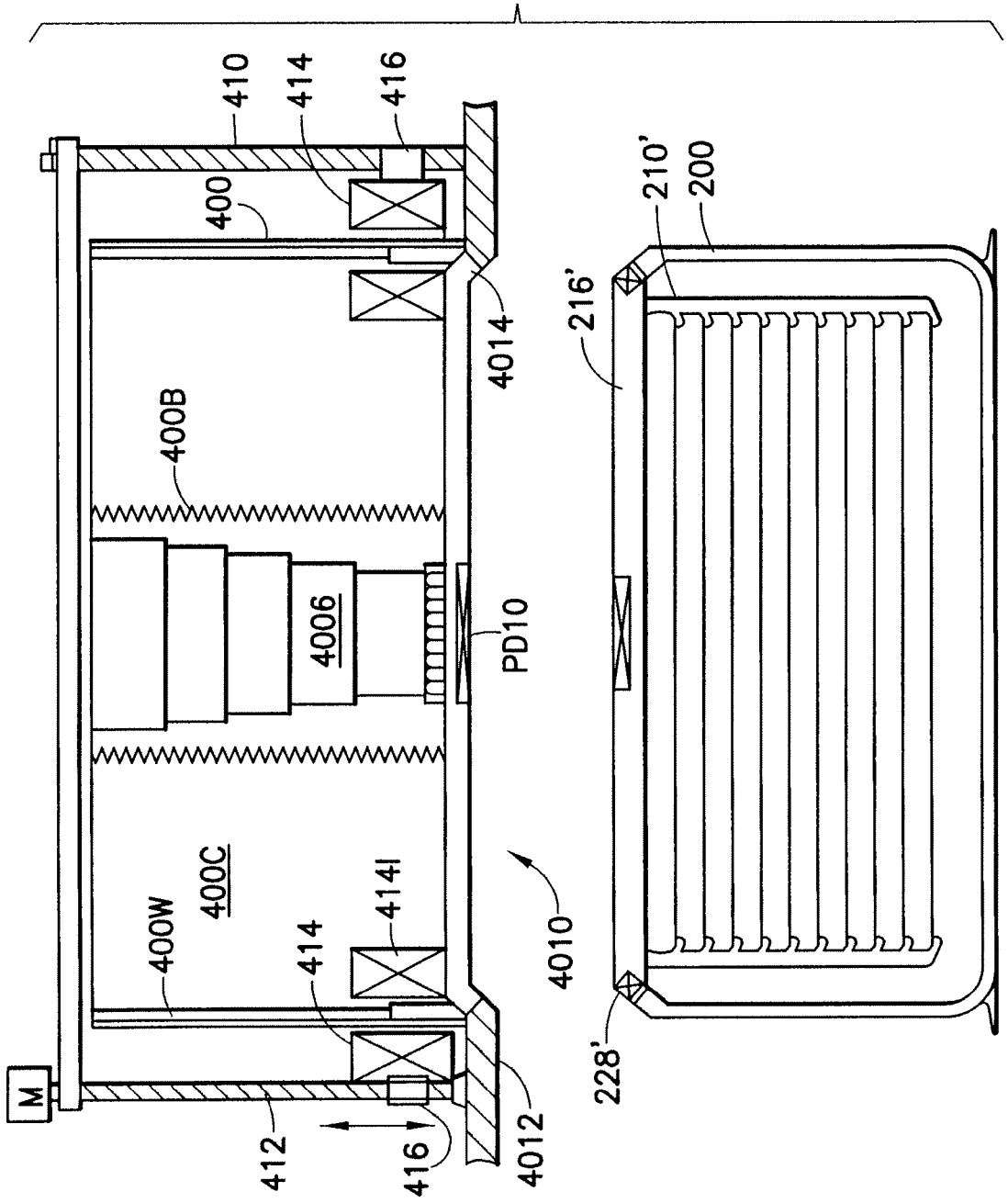
FIG. 8 is another schematic elevation view of tool interface and carrier in accordance with another exemplary embodiment.

As noted before, the carrier with passive carrier door and seal is suitable for direct interface to a vacuum capable chamber such as a load lock. FIG. 8 shows a carrier 200' (top opening) to be mated directly to a port interface 4010 of a vacuum capable chamber (referred to for convenience as load lock) 400 in accordance with another exemplary embodiment. Carrier 200' shown in FIG. 8 may be generally similar to carrier 200, 300 described before. The load lock, in the exemplary embodiment, has an indexer 410 that operates to open/close the port door 4014, and hence open/close the carrier door (in this embodiment top wall 216') and raise/lower cassette 210'. In the exemplary embodiment, the indexer 410 may be configured to provide the load lock chamber with a low or minimal Z-height. For example, the indexer 410 may be positioned exterior to the load lock chamber 400C and arranged alongside the load lock chamber to reduce overall height of chamber and load lock. In the exemplary embodiment, the indexer 410 may have a drive section 412 and a coupling section 414. In the embodiment shown, the drive section 412 may have an electromechanical drive system with for example a motor driving belt or screw drive to raise/lower shuttle 416. Coupling section 414 in the exemplary embodiment, may be a magnetic coupling that couples the shuttle 416 on the drive section to the port door 4014. The port door may for example have magnets (permanent, or electromagnets) or magnetic material located thereon forming the interior portion 414I of the magnetic coupling 414. The magnetic portion 414I of the door 4014 may also lock the port door to the port frame 4012. For example, the port frame 4012 may have suitable magnets (similar to magnets 2028' in FIG. 2B) arranged to operate with the magnetic portion/magnets 414I on the port door and lock the door and port when the door is in its closed position. In the exemplary embodiment, the magnetic lock elements in the port frame may operate with the magnetic coupling portion 414I on the door 4014. In alternate embodiments the magnetic coupling between door and drive, and magnetic lock between door and frame may have any suitable configuration. As seen in FIG. 8, the chamber walls 400W isolate the drive section 412 from the interior of the chamber 400C. In other exemplary embodiments (see also FIGS. 18-19), the drive section 412' may be linear motors (e.g. linear induction motors, LIM) that operate on a reactive portion 414I' of the port door 4014' to effect movement of the port door. The LIM may be located exterior to the chamber walls and isolated from the chamber interior. In the exemplary embodiment shown in FIGS. 18-19, the drive may include magnetic material sections 4122', or permanent magnets forming fail safe locks to hold the port door 4014' in the open position in the event of power loss to the chamber. In alternate embodiments, suitable accumulators may be connected to the drive to allow desired control for lowering the port door to the closed position. As may be realized from FIGS. 8 and 18-19, the seal between port door and port frame, in the exemplary embodiment is located so that door weight contributes to sealing the interface.

In the exemplary embodiment shown in FIG. 8, the respective section 414I of the magnetic coupling may also lock the port door 4014 and carrier door 216' to each other. For example, the carrier door may have suitable magnets (e.g. permanent magnets) or magnetic material 228' positioned to cooperate with the coupling section 414I (e.g. may include electromagnets, or magnets with variable magnetic field) when activated to lock port and carrier doors to each other. In the exemplary embodiment, the port door motion may be guided by a guide that is also isolated from the chamber. For example, in the embodiment shown, a bellows 400B connects the port door to the chamber walls and isolates the port door movement guide 4006 from the chamber. The guide in this embodiment has generally telescoping sections. The telescoping guide is shown as made from hollow cylindrical telescoping sections for example purposes, and may have any suitable configuration in alternate embodiments. In other alternate embodiments, the indexer may have any other desired configuration. For example, suitable indexing motors may be located in the chamber walls, but isolated from the chamber interior such as disclosed in U.S. patent application Ser. No. 10/624,987, filed Jul. 22, 2003, and incorporated by reference herein in its entirety, capable of effecting controlled movement of the port door without mechanical guides for the port door. The bellows 400B may be pressurized to assist port door closure. The bellows may also house umbilical systems such as vacuum line, and power/signal lines connected to the port door. In the exemplary embodiment, the port door may have a port PD10 connected to a vacuum source forming the chamber pump down port as will be described further below.

Figure 9:
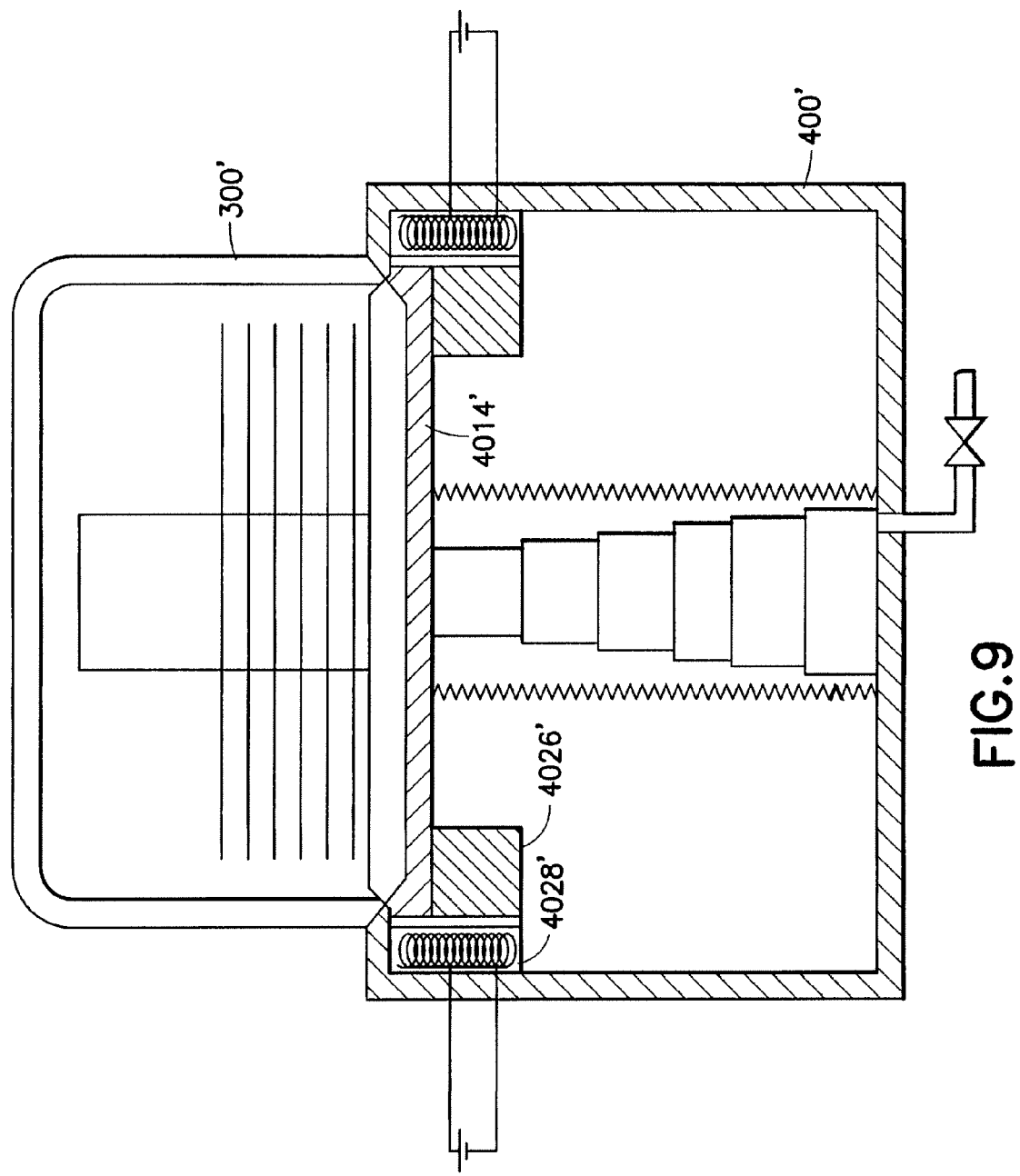
FIG. 9 is another schematic elevation view of tool interface and carrier in accordance with another exemplary embodiment.

Referring now to FIG. 9, there is shown a carrier 300' on a vacuum chamber 400' in accordance with another exemplary embodiment. In the exemplary embodiment shown, the carrier 300' may be a bottom opening carrier (similar for example to carrier 300 described before, see also FIG. 3). In the exemplary embodiment, the port door 4014' may be lowered into the chamber when opened. The indexer (not shown) may be similar to that shown in FIGS. 8, 18-19 but arranged to move the port door down. The chamber and port door may have magnetic locks 4028', 4026' for locking the door in the closed position to the chamber frame. In the exemplary embodiment the port frame may have one or more coil elements 4028' (defining the what may be referred to as the frame side portion of the magnetic locks. The coil element(s) 4028' may be positioned as desired and may generate a magnetic field that operates on door lock components 4026'. The magnetic lock components 4026' on the door may be permanent magnets or magnetic material. In the exemplary embodiment, the coil elements 4028' are shown located in the chamber for example purposes. In alternate embodiments, the coil elements may be located outside. The chamber walls, isolated from the chamber interior. The coil elements may be fixed or stationary relative to the frame. Field strength may be reduced when desired to reduce magnetic forces in the magnetic lock and ease movement of the port door. In alternate embodiments, the coil elements may be movable, for example mounted to the shuttle of the drive system and may form part of the magnetic coupling between port door and indexer. In alternate embodiments, the magnetic locks may be similar to those for locking the carrier door to the carrier described before. The permanent magnets or magnetic material 4026' on the port door 4014' that effect magnetic locking to the frame, may also provide coupling to the indexer similar to that shown in FIG. 8. The chamber in the embodiment shown in FIG. 9 may also have a bellows and port door guide similar to that shown in FIG. 8. The bellows may be pressurized to assist raising the port door and maintain in closed position, especially when carrier door and cassette are seated on the port door. In alternate embodiments, the chamber may have a bellows without a port door guide therein. Vacuum may be connected to the port door to effect chamber pump down through the port door to carrier door interface. Thus, as in the embodiment shown in FIG. 8, the chamber pump down port, in the exemplary embodiment, may be located in the port door.

Figure 10:
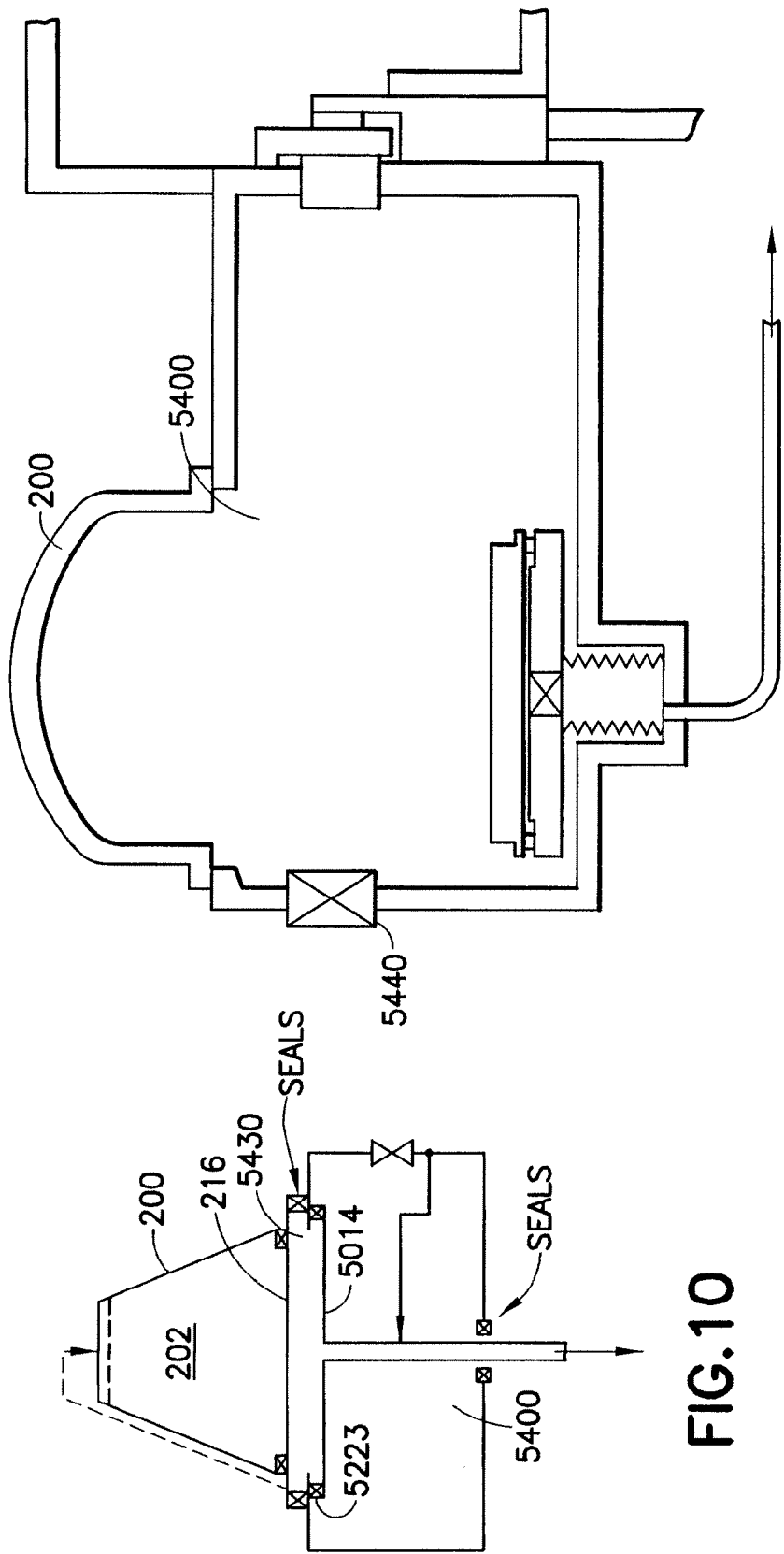
FIG. 10 is another schematic elevation view of tool interface and carrier in accordance with another exemplary embodiment.

Referring again to FIG. 8, in the exemplary embodiment load lock chamber pump down may be performed for example with the carrier interfaced to the chamber port and the port door moved by the indexer 410 from its closed position. As may be realized from FIG. 8, in the exemplary embodiment pump down of the load lock chamber, via vacuum port PD10 in the port door, may be through the carrier door 216' to port door 4014 interface. The suction flow of chamber/carrier gas through the carrier door to port door interface generates a negative pressure on the interface preventing inadvertent escape of contaminants into the chamber. FIG. 10 illustrates load lock chamber pump down through the port door 5014 in accordance with another exemplary embodiment. In this embodiment, purge of the port door to carrier door space 5430, and of the carrier chamber 202 may be performed prior to load lock chamber pump down. For example, purge gas may be introduced into space 5430 by applying vacuum and cracking a port door to port seal 5223 (or with suitable valving). The carrier 200 may be purged by cracking the carrier door 216 allowing load lock chamber 5400 gas to enter the carrier, or again by suitable valving. For example, a gas supply from the chamber (shown in phantom in FIG. 10) may be provided to the carrier to introduce a desired gas species in the carrier 200. As seen in FIG. 10A, which illustrates the load lock chamber 5400 and carrier 200 with the port door and carrier door moved to the open position the load lock chamber 5400 may have a vent (or gas species supply) 5440 disposed as desired in the load lock walls, to vent the load lock chamber. Accordingly, the purge line may, in the exemplary embodiment, be used for purging, and venting of the chamber may be performed independent of the carrier door to port door interface.

Figure 11:
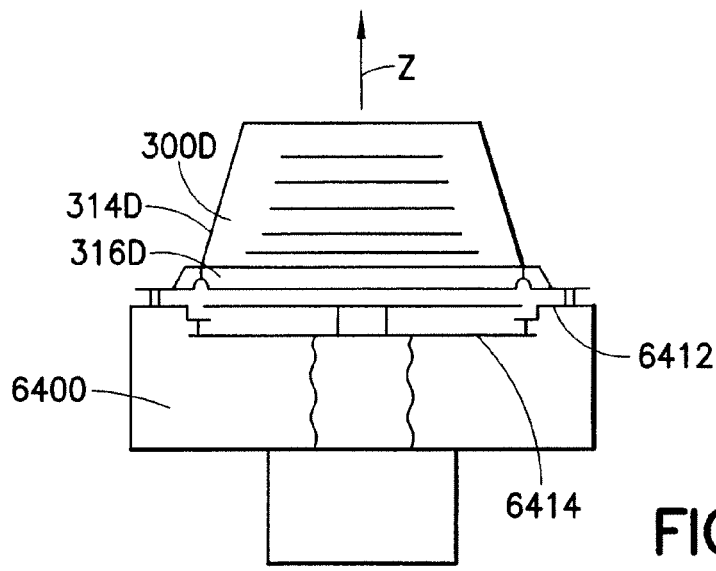
FIG. 11 is a schematic elevation view of a process tool section and carrier interface therewith in accordance with another exemplary embodiment.
Figure 12A:
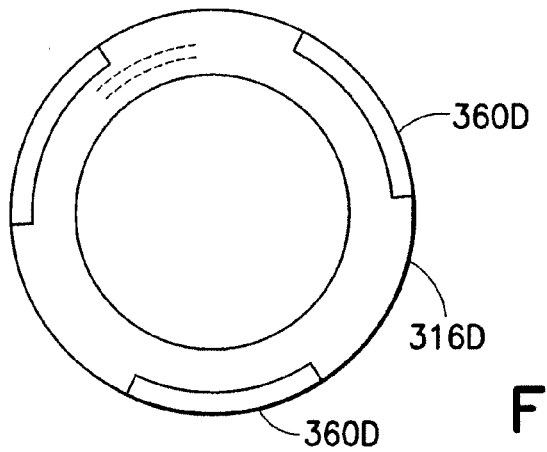
FIGS. 12A-12B are schematic bottom views of the carrier (workpiece transfer) opening and carrier door of the carrier in FIG. 11.
Figure 12B:
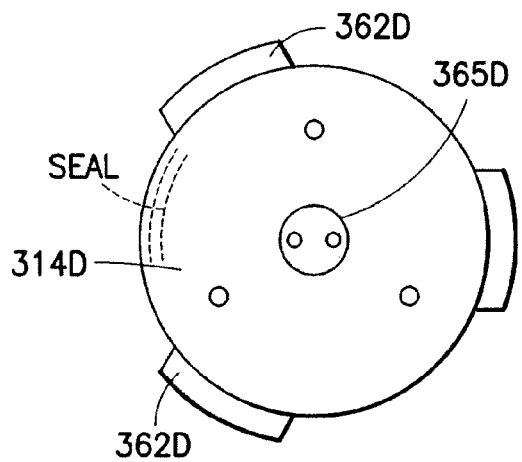
Figure 13A:
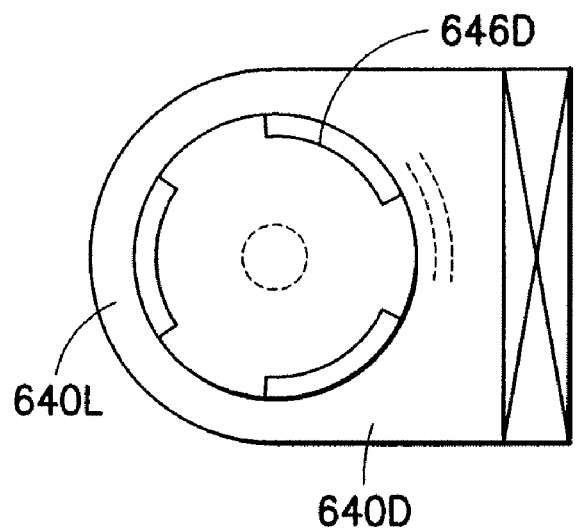
FIGS. 13A-13B are schematic top plan views of the interface and a tool to carrier door interface of the tool section in FIG. 11.
Figure 13B:
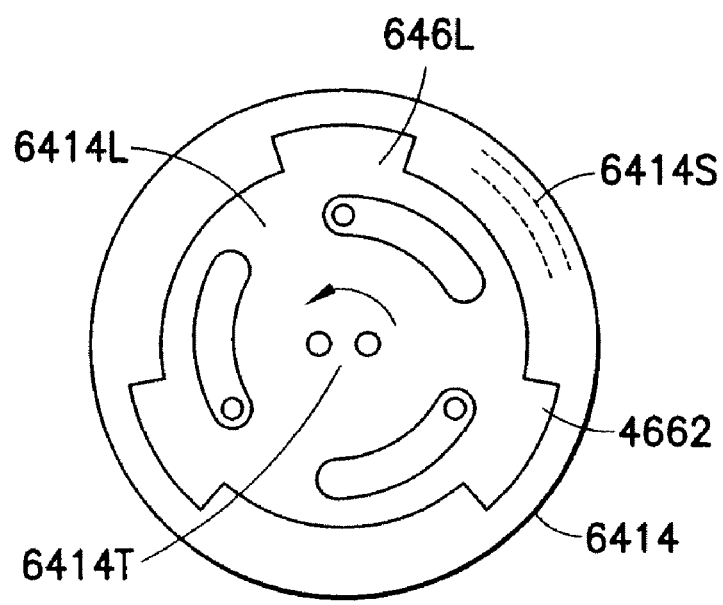

FIG. 11 illustrates an exemplary embodiment where the carrier door 316A and port door 6414 have respective mechanical "failsafe" locks respectively locking the carrier door to carrier 3140 and port door to port 6412 or chamber 6400D. The carrier 314D, carrier door 316D, port 6412 and port door 6414 may be passive (no articulated locking parts). In this embodiment, the indexer may be capable of both Z axis indexing of the port door and of rotating the port door (for example about the Z axis) for engaging/disengaging the lock tabs on the port door and carrier door. In alternate embodiments, Z axis movement and rotation of the port door may be provided via different drive shafts. FIGS. 12A-12B respectively show bottom views of the carrier shell 314D and the carrier door 316D. FIGS. 13A-13B respectively show top plan views of the port 6412 in the (load lock) chamber 6400 and the port door 6414. In the exemplary embodiment, the lower surface of the carrier shell has engagement tabs/surfaces 360D, that are engaged by engagement surfaces 362D on the carrier door 316D. As may be realized, engagement/disengagement between engagement surfaces 360D, 362D may be effected via rotation of carrier door relative to the carrier 314D. Rotation of the carrier door is imparted by the port door 6414 as will be described below. In alternate embodiments the engagement surfaces between door and carrier may have any desired configuration. The carrier door 316D may have a male/female torque coupling feature 365D complementing a torque coupling member on the carrier door 6414T. In the exemplary embodiment shown, the port 6412 and port door 6414 may have interlocking or engagement surfaces generally similar to the engagement features of the carrier and carrier door. As seen best in FIGS. 13A, 13B, the port may have engagement surfaces 6460 (for example projecting inwards), and the port door 6414 may have complementing engagement surfaces 6462 to overlap and engage port surfaces 6460. As may be realized, in the exemplary embodiment the engagement surface 3600, 3620 on the carrier, and the engagement surfaces 6460, 6462 on the port are located relative to each other to allow simultaneous engagement/disengagement between carrier and carrier door, and port and port door when the port door is rotated.

Figure 14:
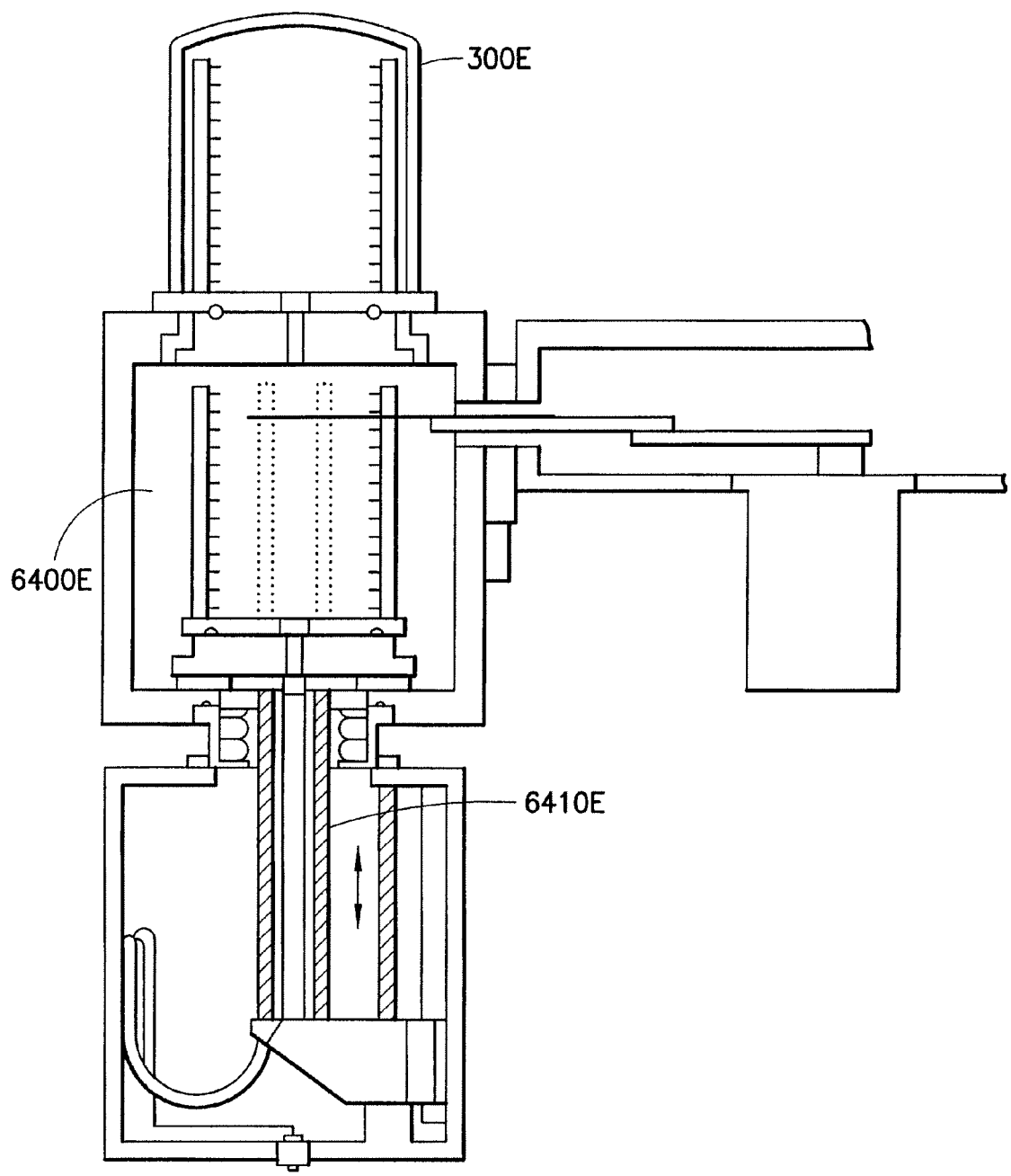
FIG. 14 is a schematic elevation of a process tool and carrier interfaced therewith in accordance with still another exemplary embodiment.
Figure 15:
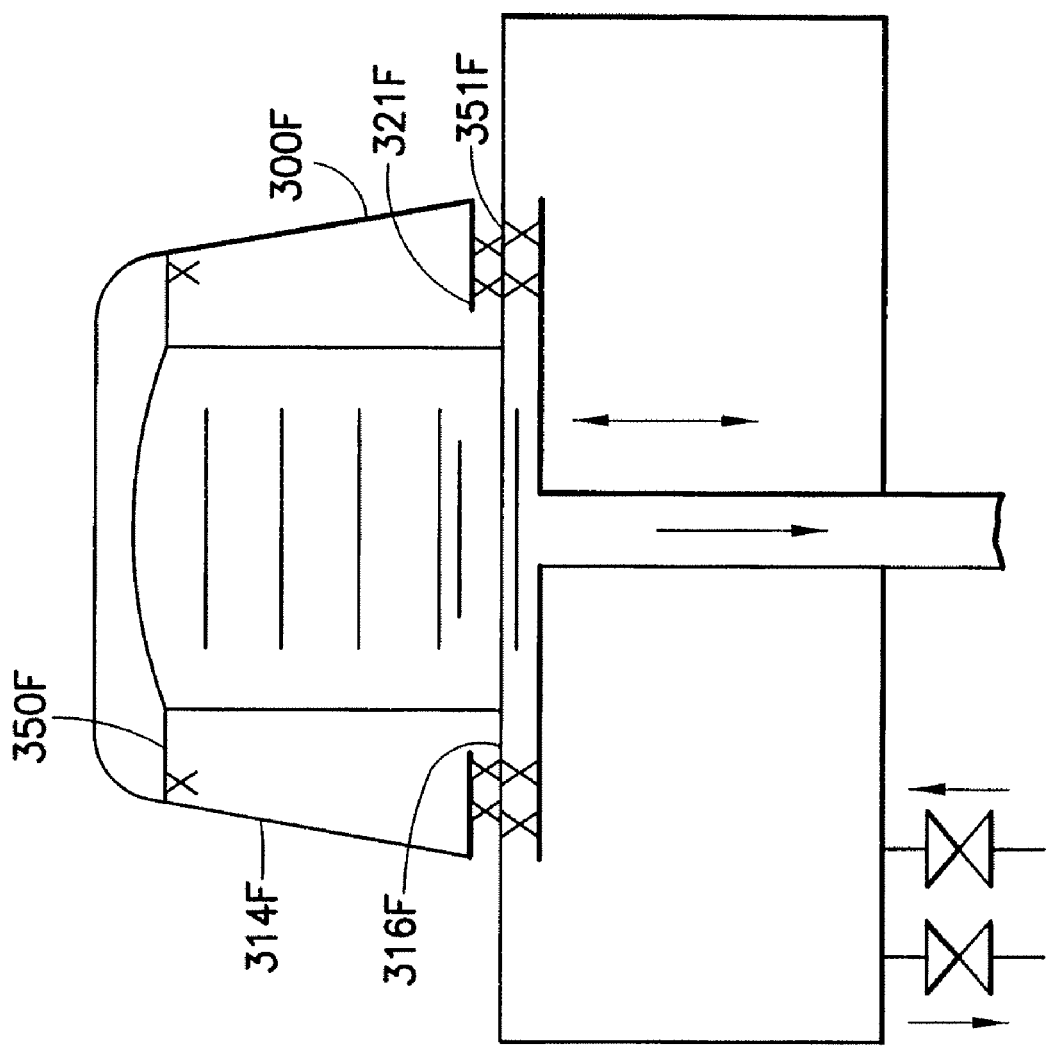
FIG. 15 is a schematic elevation view of a tool interface and carrier in accordance with yet another exemplary embodiment.

FIG. 14 illustrates load lock chamber 400E and indexer 6410E and carrier 300E. In the exemplary embodiment the indexer may be located substantially axially in series with the load lock chamber. Similar to pod 200, 300, 3000, pod 300E in the exemplary embodiment shown in FIG. 4 may be a vacuum compatible top or bottom opening pod with features similar to those described before. Chamber 6400E may be similar to the chambers described previously. FIG. 15 shows a load lock chamber and carrier 300F having a reduced pump down volume configuration. In the exemplary embodiment shown, the carrier door 316F may have top 350F and bottom 321F door to carrier shell 314F seals. The bottom seals 3270F (similar for example to seals 221) engage the shell 314F when the carrier door is closed, as shown in FIG. 15. The top seals 350F seal against the carrier shell when the carrier door is opened (for example seal 350F may seat and seal against carrier seat surface 351F). The top seal 350F isolates the carrier chamber from the load lock chamber, hence reducing the pump down volume when pumping the load lock chamber to vacuum.

Figure 16A:
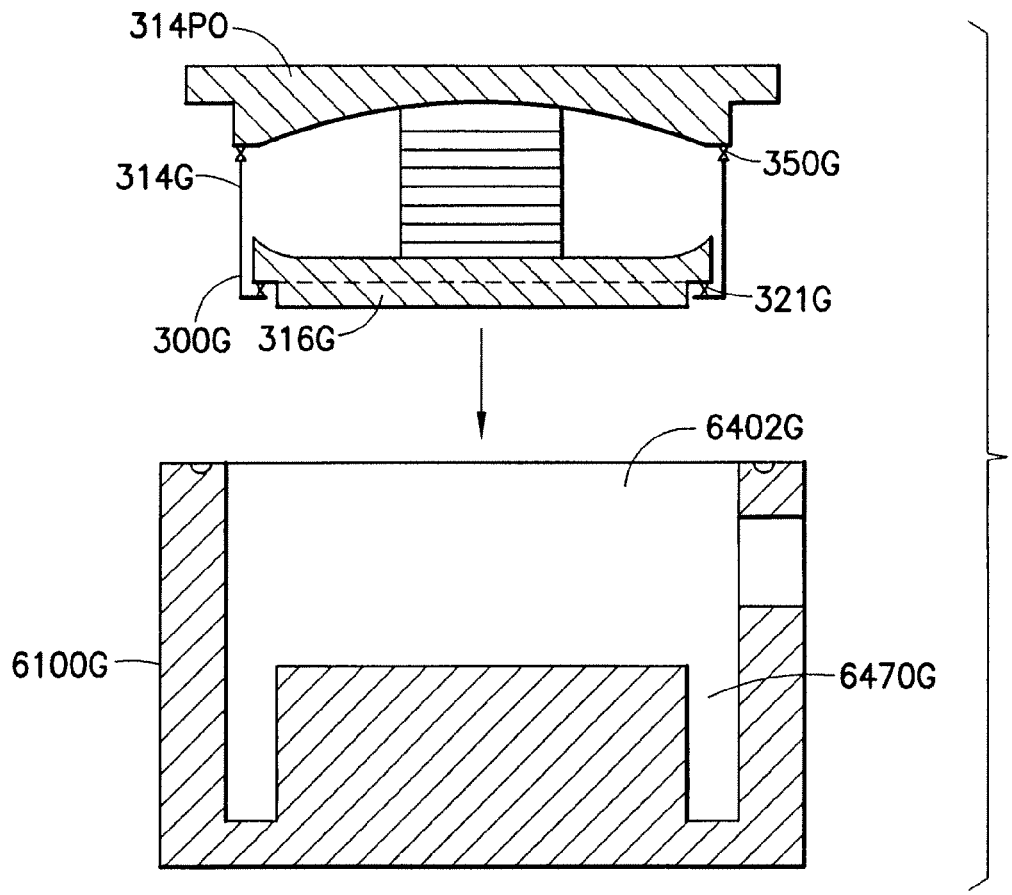
FIGS. 16A-16B are schematic elevation views of a tool interface and carrier respectively shown on two different positions in accordance with another exemplary embodiment.
Figure 16B:
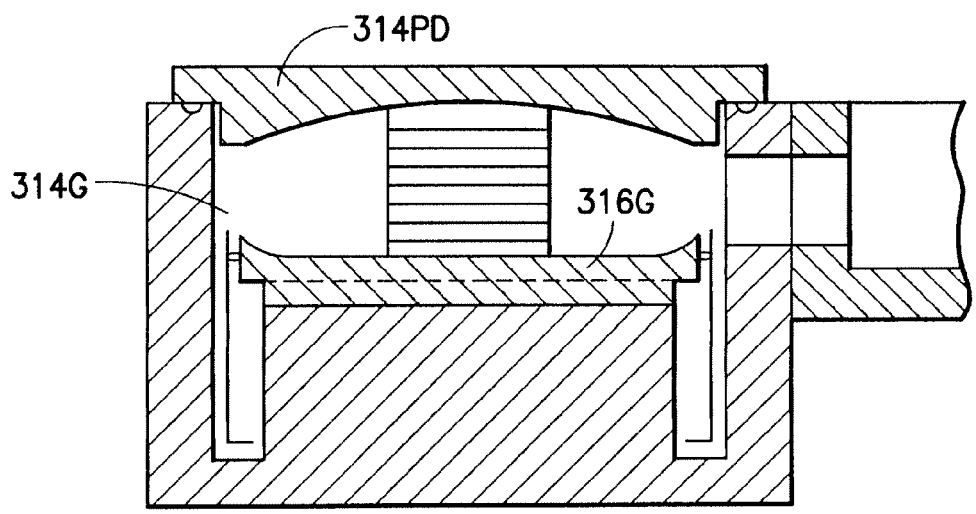
Figure 17:
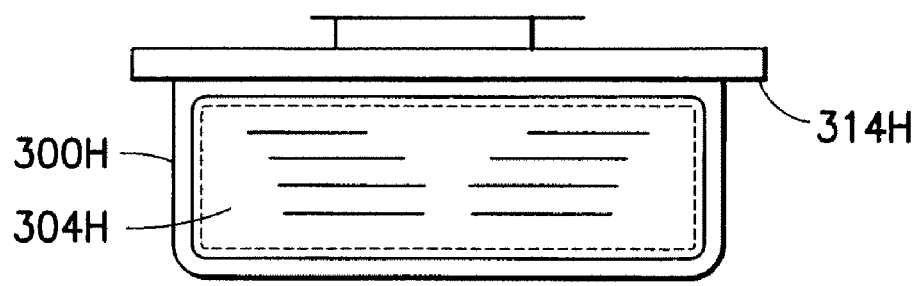
FIG. 17 is a schematic side view of a carrier.
Figure 17A:
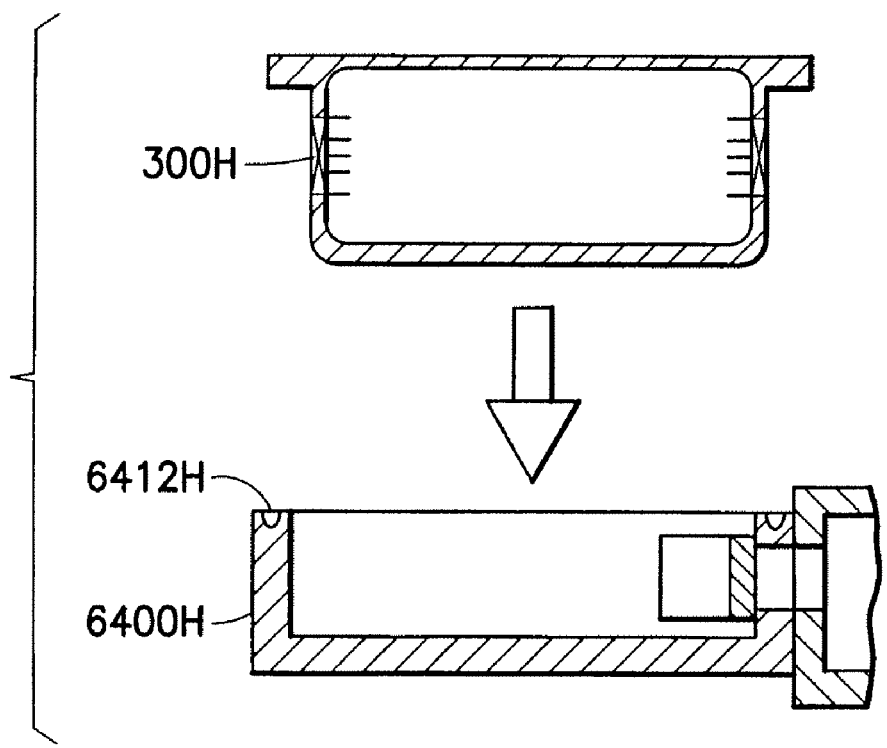
FIGS. 17A-17C are other schematic elevation views of the carrier and a tool interface and a plan view of the tool interface in accordance with another exemplary embodiment.
Figure 17B:
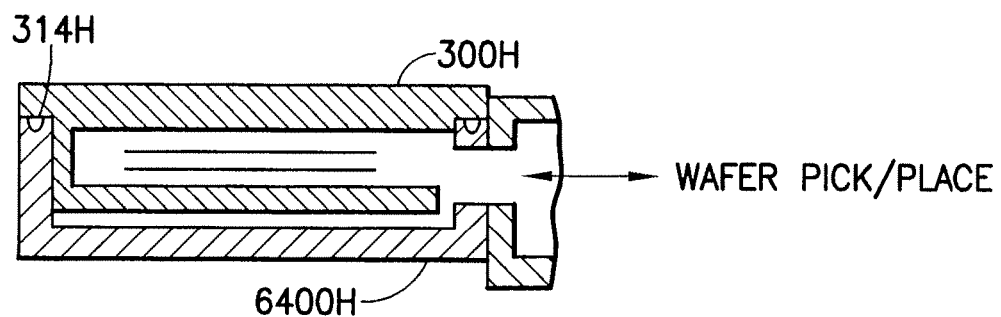
Figure 17C:
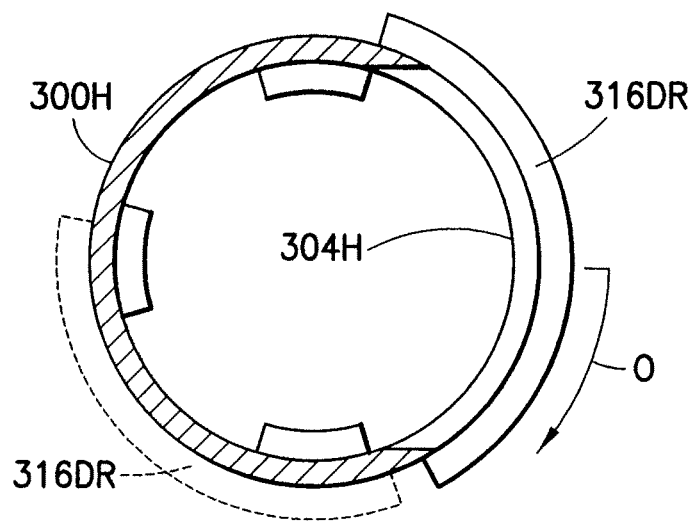

FIGS. 16A-16B show a carrier 300G and load lock chamber 6400G respectively in docked and undocked positions in accordance with another exemplary embodiment. Carrier 300G has a bottom wall 316G, annular section 314G and a top wall 314PD. In this embodiment the annular section 314G or one or more portions thereof may operate as a carrier door. The top and bottom walls 316G, 314PD may be fixed together and the movable section 314G, defining the door, may have seals 350G, 321G both top and bottom for respectively sealing to the top and bottom walls 316G, 314PD. Load lock chamber 6400G may have an open port 6402G through which the carrier 300G may be nested into the load lock chamber as seen in FIG. 16B. The load lock chamber 6400G may have a recess 6470G for lowering the carrier door 314G to open access to the carrier. The top wall 314PD of the carrier may seal against the load lock chamber port thereby sealing the load lock chamber and allowing pump down of the chamber. A suitable elevator may be provided to raise/lower the carrier door 314G. FIGS. 17-17C, show another top sealing carrier 300H and load lock chamber 6400H in accordance with another exemplary embodiment. The carrier 300H may have a top sealing flange 314H and side opening 304H (along a carrier edge for loading/unloading of workpieces). In the exemplary embodiment, the carrier top sealing flange 314H seats and seals against the rim 6412H of the chamber port as shown best in FIG. 17B. The carrier door 314DR may be opened by radial outward and rotational motion indicated by arrow 0 in FIG. 17C. The carrier opening is aligned with a slot valve in the load lock chamber. Although the exemplary embodiments have been described with specific reference to a load lock chamber, the features described are equally applicable to a load port chamber such as shown in FIG. 18. The interior of the load port chamber may have a controlled atmosphere, but may not be isolatable.

Referring to FIGS. 29A and 29B, there is shown a schematic plan view of an automated material handling system 10, 10' in accordance with another exemplary embodiment. The automated material handling system 10, 10' shown for example, in FIGS. 29A and 29B generally includes one or more intrabay transport system section(s) 15, one or more interbay transport system section(s) 20, bay queue sections 35, transport sidings or shunt sections 25 and workpiece carriers or transports. The terms intrabay and interbay are used for convenience and do not limit the arrangement of the transport system 10110' (as used herein inter generally refers to a section extending across a number of groups, and intra refers generally to a section extending for example within a group). The transport system sections 15, 20, 25, 35 may be nested together (i.e. one transport loop within another transport loop) and are generally arranged to allow the high-speed transfer of semiconductor workpieces, such as for example, 200 mm wafer, 300 mm wafers, flat display panels and similar such items, and/or their carriers to and from, for example, processing bays 45 and associated processing tools 30 in the processing facility. In alternate embodiments, any suitable material may be conveyed in the automated material handling system. The transport system 10 may also allow for the redirection of workpieces from one transport section to any another transport section. An example of an automated material handling system for transporting workpieces having interbay and intrabay branches can be found in U.S. patent application entitled "Automated Material Handling System" having Ser. No. 10/697,528 previously incorporated herein by reference in its entirety.

The configurations of the automated material handling system 10, 10' shown in FIGS. 29A and 29B are representative configurations, and the automated material handling system 10, 10' may be disposed in any suitable configuration to accommodate any desired layout of processing bays and/or processing tools in a processing facility. As can be seen in FIG. 29A, in the exemplary embodiment the interbay transport sections 15 may be located on one or more side(s) of and connected to each other by any number of transport sections 20, corresponding for example to one or more processing bay(s) 45. In alternate embodiments the outer or side transport sections may be intrabay sections, and the sections traversing in between may be linking the intrabay sections to groups or arrays of processing tools within a bay. The interbay transport sections 15 of FIG. 29A, in the exemplary embodiment, may also be connected by a cross-shunt 50 that allows the movement of a workpiece transport directly between interbay transport sections 15 without passing through a processing or fab bay 45. In yet other alternate embodiments, the transport sections 15 may be connected to each other by additional intrabay transport sections (not shown). In other exemplary embodiment(s), such as shown in FIG. 29B, the interbay transport section 15 may be located between any number of processing bays 45, hence forming for example a generally center isle or a transport central artery between the branch sections serving bays or tool groups 45. In other alternate embodiments, the intrabay transport section may form a perimeter around and enclose any number of processing bays 45. In yet other alternate embodiments, there may be any number of nested loop sections such as for example N number of systems, such as system 10 or 10' as shown in FIGS. 29A and 29B, connected generally in parallel by transport sections that directly connect each of the interbay transport sections 15. In still other alternate embodiments, the transport sections 15, and processing tools may have any suitable configuration. In addition, any number of intrabay/interbay systems may be joined together in any suitable configuration to form nested processing arrays.

The interbay transport section 15, for example may be a modular track system that provides for the movement of any suitable workpiece transport. Each module of the track system may be provided with a suitable mating means (e.g. interlocking facets, mechanical fasteners) allowing the modules to be joined together end to end during installation of the intrabay transport sections 15. The rail modules may be provided in any suitable length, such a few feet, or in any suitable shape, such as straight or curved, for ease of handling during installation and configuration flexibility. The track system may support the workpiece transport from beneath or in alternate embodiments, the track system may be a suspended track system. The track system may have roller bearings or any other suitable bearing surface so that the workpiece transports can move along the tracks without substantial resistance over the rollers. The roller bearing may be tapered or the tacks may be angled towards the inside of a curve or corner in the track to provide additional directional stability when the workpiece container is moving along the track.

The intrabay transport sections 15 may be a conveyor based transport system, a cable and pulley or chain and sprocket based transport system, a wheel driven system or a magnetic induction based transport system. The motor used to drive the transport system may be any suitable linear motor with an unlimited travel capable of moving workpiece containers along the intrabay transport sections 15. The linear motor may be a solid state motor without moving parts. For example, the linear motor may be a brushed or brushless AC or DC motor, a linear induction motor, or a linear stepper motor. The linear motor may be incorporated into the intrabay transport sections 15 or into workpiece transports or containers themselves. In alternate embodiments, any suitable drive means may be incorporated to drive the workpiece transports through the intrabay transport system. In yet other alternate embodiments, the intrabay transport system may be a pathway for trackless wheeled autonomous transport vehicles.

As will be described below, the intrabay transport sections 15 generally allow for uninterrupted high-speed movement or flow of the workpiece transports along the path of the intrabay transport sections 15 through the use of queue sections and shunts. This is highly advantageous compared to conventional transport systems that have to stop the flow of material when a transport container is added or removed from a transport line.

As noted before, in the exemplary embodiment, the intrabay transport sections 20 may define processing or fab bays 45 and may be connected to the interbay transport section(s) 15 through queue sections 35. The queue sections 35 may be located for example on either side of the interbay or intrabay transport sections 15, 20 and allow a workpiece or workpiece container to enter/exit the intrabay transport sections 20 without stopping or slowing down the flow of material along either the interbay transport sections 15 or the flow of material along the intrabay transport sections 20. In the exemplary embodiment, the queue section 35 are schematically shown as discrete sections from transport sections 15, 20. In alternate embodiments the queue section, or the queue paths between transport sections 15, 20 may be formed integral to the transport sections but defining discrete queue transport paths between transport sections. In alternate embodiments the queues may be positioned on the interbay and intrabay sections as desired. An example of a transportation system having a travel lane and an access or queue lane, allowing selectable access on and off the travel lane without impairment of the travel lane, is described in U.S. patent application entitled "Transportation System" with Ser. No. 11/211,236 previously incorporated herein by reference in its entirety. The intrabay transport sections 20 and the queue sections 35 may have track systems that are substantially similar to that described above for the interbay transport sections 15. In alternate embodiments, the intrabay transport sections and the queue sections tying intra and inter transport sections may have any suitable configuration, shape or form and may be driven in any suitable manner. As can best be seen in FIG. 29A, in the exemplary embodiment the queue sections 35 may have an input section 35A and an output section 35B that correspond to the direction of movement R1, R2 of the intrabay and interbay transport sections 20, 15. The convention used herein for example purposes defines section 35A as input to section 20 (exit from section 15) and section 35B as exit/output from section 20 (input to section 15). In alternate embodiments the travel direction of the queue sections may be established as desired. As will be described below in greater detail, workpiece containers may exit the interbay transport sections 15 via the input section 35A and enter the interbay transport sections 15 via the output section 35B. The queue sections 35 may be of any suitable length to allow for the exiting or entering of the workpiece transports on and off the transport sections 15, 20.

The intrabay transport sections 20 may extend within corridors or passages connecting any number of process tools 30 to the transport system 10, 10'. The intrabay transport sections 20 may also connect two or more interbay transport sections 15 to each other as shown in FIG. 29A and as described above. The intrabay transport sections 20 are shown in FIGS. 29A and 29B as having an closed loop shape however, in alternate embodiments they may have any suitable configuration or shape and may be adaptable to any fabrication facility layout. In the exemplary embodiment, the intrabay transport sections 20 may be connected to the process tool(s) 30 through a transport siding or shunt 25, which may be similar to the queue section 35. In alternate embodiments, shunts may be provided on the interbay transport sections in a similar manner. The shunts 25 effectively take the workpiece transports "off line" and have for example input sections 25A and output sections 25B corresponding to the direction of travel R2 of the interbay transport sections 20 as can be seen in FIG. 29A. The shunts 25 allow the workpiece transports to exit and enter the intrabay transport sections 20, through the input and output sections 25A, 25B, substantially without interrupting the substantially constant velocity flow of workpiece transports on the intrabay transport sections 20. While in the shunt 25, the workpiece container may, for example, stop at a tool interface station that corresponds to the location of the process tool station 30, so that the workpieces and/or the container itself may be transferred into the process tool load port or any other suitable workpiece staging area by or through any suitable transfer means, such as for example, an equipment front end module, sorter or any other suitable transfer robot. In alternate embodiments, workpiece transports may be directed to desired shunts to effect reorder (e.g. reshuffling) of the transports on the given transport section.

The switching of the workpiece carriers or transports from and between the different sections 15, 20, 25, 35 may be controlled by a guidance system (not shown) connected to a controller (not shown). The guidance system may include positioning devices allowing for position determination of the transports moving along the sections 15, 20, 25, 35. The positioning devices may be of any suitable type such as continuous or distributed devices, such as optical, magnetic, bar code or fiducial strips, that extend along and across the sections 15, 20, 25, 35. The distributed devices may be read or otherwise interrogated by a suitable reading device located on the transport to allow the controller to establish the position of the transport on the section 15, 20, 25, 35 as well as the kinematic state of the transport. Alternatively, the devices may sense and/or interrogate a sensory item, such as a RFID (rapid frequency identification device), on the transport, workpiece carrier or workpiece, to identify position/kinematics. The positioning devices may also include, alone or in combination with the distributed devices, discrete positioning devices (e.g. laser ranging device, ultrasonic ranging device, or internal positioning system akin to internal GPS, or internal reverse GPS) able to sense the position of the moving transport. The controller may combine information from the guidance system with the position feed back information from the transport to establish and maintain the transport paths of the transport along and between the sections 15, 20, 25, 35.

In alternate embodiments, guidance system may include or have grooves, rails, tracks or any other suitable structure forming structural or mechanical guide surface to cooperate with mechanical guidance features on the workpiece transports. In still other alternate embodiments, the sections 15, 20, 25, 35 may also include electrical lines, such as a printed strip or conductor providing electronic guidance for the workpiece transports (e.g. electrical lines sending a suitable electromagnetic signal that is detected by a suitable guidance system on the transports).

Still referring to FIGS. 29A and 29B, an exemplary operation of the transport system 10, 10' will now be described. A workpiece container, located for example in a shunt 25 may enter the transport system 10, 10'. To maintain the flow of the intrabay transport section 20 substantially uninterrupted and moving at a generally constant velocity, the workpiece container may access the interbay transport section 20 via shunt 25. The workpiece transport accelerates within the shunt 25 so that the transport is traveling the same speed as the flow of material in the intrabay transport section 20. The shunt 25 allows the workpiece transport to accelerate, and hence the transport may merge into the flow of the intrabay transport section 20 without hindering that flow or colliding with any other transports traveling in the interbay transport section 20. In merging with the intrabay transport section 20, the workpiece transport may wait in the shunt 25 for suitable headway so that it may enter the flow of the intrabay transport section freely, without colliding with any other workpiece carriers or transports or causing reduction in velocity of transports traversing the intrabay section. The workpiece transport continues, for example, along the intrabay transport section 20 at a substantially constant speed and switches, with the right-of-way, onto the output queue area or section 35B for example to switch an interbay section 15. In one embodiment, if there is no room within the output queue section 35B, the transport may continue to travel around the intrabay transport section 20 until the output queue section 35B becomes available. In alternate embodiments, cross shunts may be provided connecting opposing travel paths of the transport section, allowing transports to switch between transport paths to, for example, return to a bypassed station without traveling the whole loop of the transport section. The transport may wait in the bay output queue section 35B for suitable headway, then accelerate and merge into the generally continuous constant velocity flow of the interbay transport section 15 in a manner substantially similar to the merge described above for the intrabay transport section 20. The transport may for example continue at a generally continuous speed along the interbay transport section 15 to a predetermined bay and is switched onto the associated queue input section 35A for entry to desired intrabay section 20. In one embodiment, if there is no room within the input queue section 35A, the transport may continue to travel around the intrabay transport section 15 until the input queue section 35A becomes available in a manner similar to that described previously. The transport may wait in the input queue section 35A for suitable headway and accelerate to merge onto a second intrabay transport section 20, the second intrabay transport section 20 again having a continuous constant velocity flow. The transport is switched off of the second intrabay transport section 20 and onto the transport shunt 25 where the transport interfaces with the process tool 30. If there is no room in the shunt 25 for the transport, due to other transports in the shunt 25, the transport continues to travel along the intrabay transport section 20, with the right-of-way, until the shunt 25 becomes available. Because the flow of material in the interbay transport sections 15 and the intrabay transport sections 20 is substantially uninterrupted and travels at a generally constant velocity, the system can maintain a high throughput of workpiece transports between processing bays and processing tools.

In the exemplary embodiment shown in FIG. 29A, the transport may travel directly between processing bays via an extension 40 that may directly connect the queue sections 35, processing tools, intrabay transport sections 20 or interbay transport sections 15 together. For example, as shown in FIGS. 29A and 29B, extensions 40 connect the queue sections 35 together. In alternate embodiments, the extensions 40 may provide access from one processing tool to another processing tool by connecting the transport shunts, similar to shunts 25, of each of the tools together. In yet other alternate embodiments, the extensions may directly connect any number or any combination of elements of the automated material handling system together to provide a short access route. In larger nested networks, the shorter path between destinations of the transport created by the extensions 40 may cut down traveling time of the transports and further increase productivity of the system.

In still other alternate embodiments the flow of the automated material handling system 10, 10' may be bi-directional. The transport sections 15, 20, 25, 35, 40, 50 may have side by side parallel lanes of travel each moving in opposite directions with exit ramps and on ramps looping around and connecting the opposite lanes of travel. Each of the parallel lanes of the transport sections may be dedicated to a given direction of travel and may be switched individually or simultaneously so that the travel for each of the respective parallel lanes is reversed according to a transport algorithm to suit transport loading conditions. For example, the flow of material or transports along the parallel lanes of a transport section 15, 20, 25, 35, 40, 50 may be flowing in its respective direction. However, if at a later time it is anticipated that some number of workpiece transports are situated in the facility and are going to a location where it would be more efficient to move along one of those parallel lanes in a direction opposite the current flow direction, then the travel directions of the parallel lanes may be reversed.

In alternate embodiments, the bi-directional lanes of travel may be located in stacks (i.e. one above the other). The interface between the process tool and the transport shunts 25 may have an elevator type configuration to raise or lower a transport from a shunt to the process tool load port, for example, such as where a shunt having a clockwise flow of material is located above a shunt with a counterclockwise flow of material. In alternate embodiments, the bi-directional shunts and other transport sections may have any suitable configuration.

Figure 20:
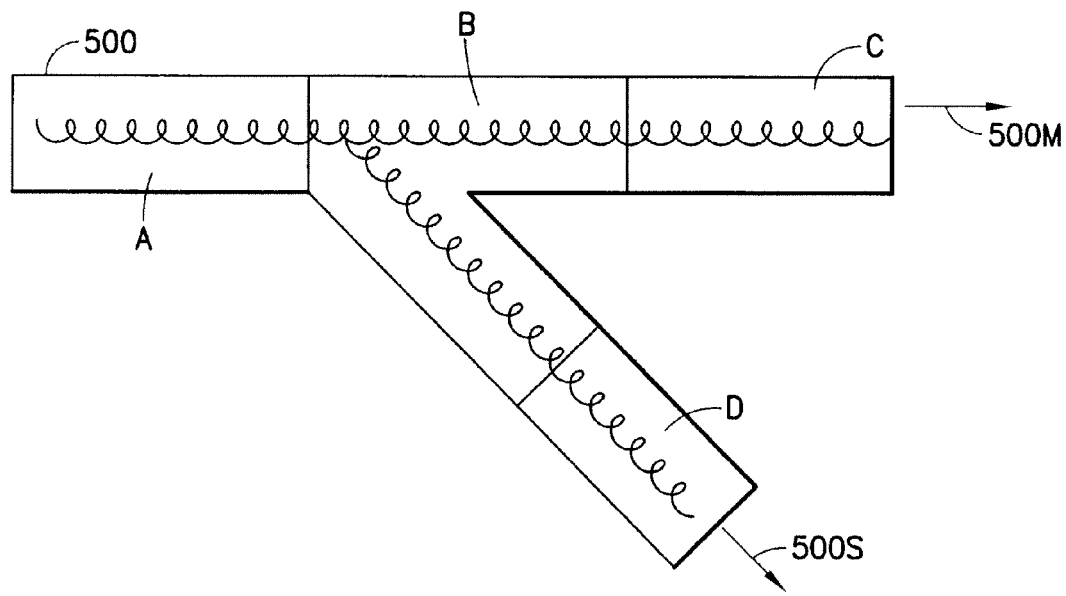
FIG. 20 is a schematic plan view of a transport system in accordance with another exemplary embodiment.
Figure 20C:
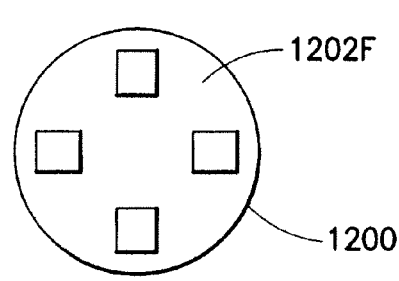
FIGS. 20C-20D are schematic bottom views of a different payloads of the transport system in accordance with other exemplary embodiments.
Figure 20D:
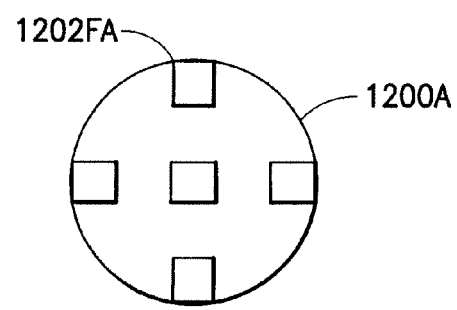
Figure 20A:
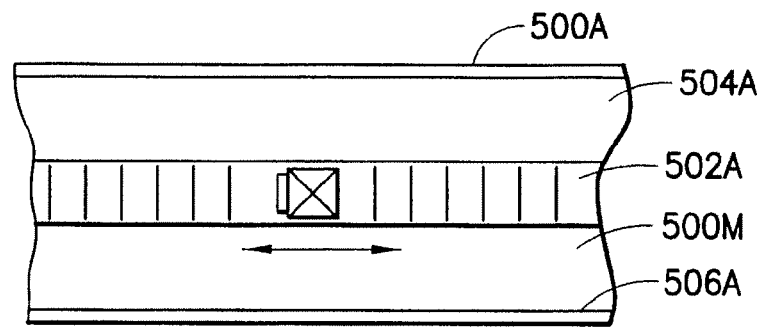
FIGS. 20A-20B are schematic partial plan views of portions of the transport system track in FIG. 10.

FIG. 20 shows a portion of a transport system track 500 of a transport system, for transporting carriers between tool stations in accordance with another exemplary embodiment. The track may have a solid state conveyor system, similar to that described in U.S. patent application Ser. No. 10/697,528 previously incorporated by reference. The track may have stationary forcer segments cooperating with reactive portion integral to the carrier shell/casing. The carrier may thus be transported directly by the conveyor. The transport system 500 shown in an asynchronous transport system in which transport of carriers is substantially decoupled from the actions of other carriers on the transport system. The track system is configured to eliminate determining factors affecting transport rate of a given carrier due to actions of other carriers. Conveyor track 500 employs main transport paths with on/off branching paths (see also FIGS. 29A-29B) that routes a carrier away from the main transport path to effect routing changes and/or interface with tool stations (buffer, stocker, etc.) without impairing transport on main transport path. Suitable example of transport system with branching on/off paths is disclosed in U.S. patent application Ser. No. 11/211,236 previously incorporated by reference. In this embodiment segments 500A, C, D may have winding sets for A1-D linear motor causing movement along the main travel path 500M (this is shown in FIG. 20A). Segment 500B is illustrated for example in FIG. 20 as an off/exit to what may be referred to as access path 500S. The windings of the forcer in this segment be arranged to provide in effect a 2-D planar motor to allow both motion along main path 500M and when desired effect movement of the carrier(s) along path 500S (see FIG. 20B). The motor controller may be a zoned controller similar to the distributed control architecture described in U.S. patent application Ser. No. 11/178,615, filed Jul. 11, 2005 incorporated by reference herein in its entirety. In this embodiment, the drives/motors may be zoned, efficiently controlled by zone controllers with appropriate hand off between zones. The conveyor 500 may have suitable bearings to movably support carrier. For example, in segments 500A, 500C and 500D, bearings (e.g. roller, ball may allow 1 degree of freedom movement of the carrier along path 500M).

Figure 20B:
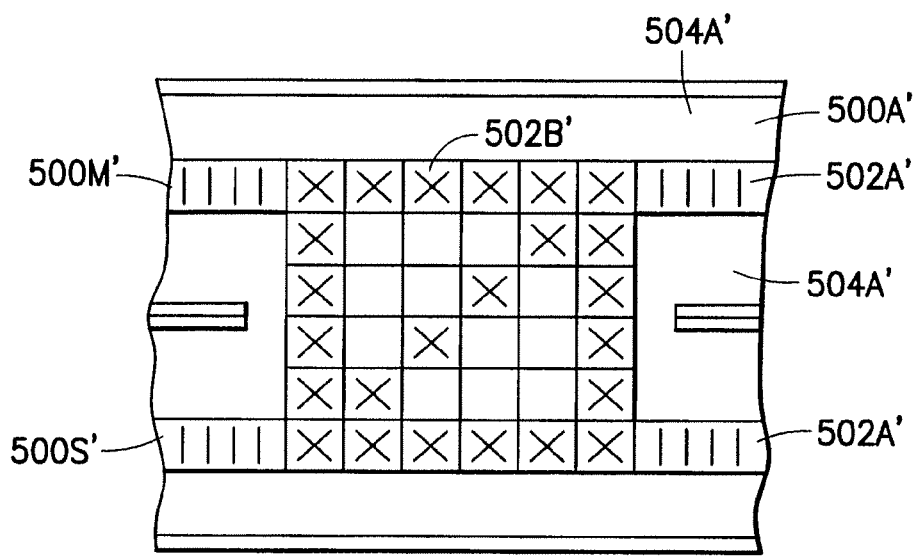

Bearings in segment 500B may allow 2-degree of freedom movement of the carrier. In other embodiments, bearings may be provided on the carrier. In still other embodiments air bearings may be used to movably support the carrier on the track. Guidance of the carriers between path 500M and direction onto path 500S may be effected by suitable guide system such as steerable or articulated wheels on the carrier, articulated guide rails on the track, or magnetic steerage as shown in FIG. 20B.

FIG. 20A illustrates an exemplary transport element 500A of system 500. The exemplary embodiment shown illustrates a segment with single travel lane or path (e.g. path 500M). As seen in FIG. 20A, in the exemplary embodiment the segment has linear motor portion or forcer 502A and support surface (s) 504(A) for motive supports on the transport. As noted before, in alternate embodiments the transport segment may have any other desired configuration. In the exemplary embodiment, guide rails 506A may be used to guide the transport. In alternate embodiments, the transport segment may have magnets or magnetic bearings in lieu of rails for transport guidance. An electromagnet on the carrier may be used to assist decoupling the carrier from the track. FIG. 20B illustrated another transport segment of the transport system 500 in accordance with another exemplary embodiment. Segment 500A' may have multiple travel lanes or tracks (for example intersecting lanes similar to segment 500B shown in FIG. 20) or substantially parallel main travel lanes (similar to paths 500M) with switching therebetween. As seen in FIG. 20B, in the exemplary embodiment, the travel lanes (similar to paths 500M, 500S) are generally defined by the 1-D motor sections 502A1 and corresponding carrier motive support surfaces/areas 504A'. The intersection or switch between the travel lanes is formed by an array of 2-D motor elements capable of generating desired 2-D forces on the transport to effect traverse between travel lanes 500M', 500S'.

Figure 21:
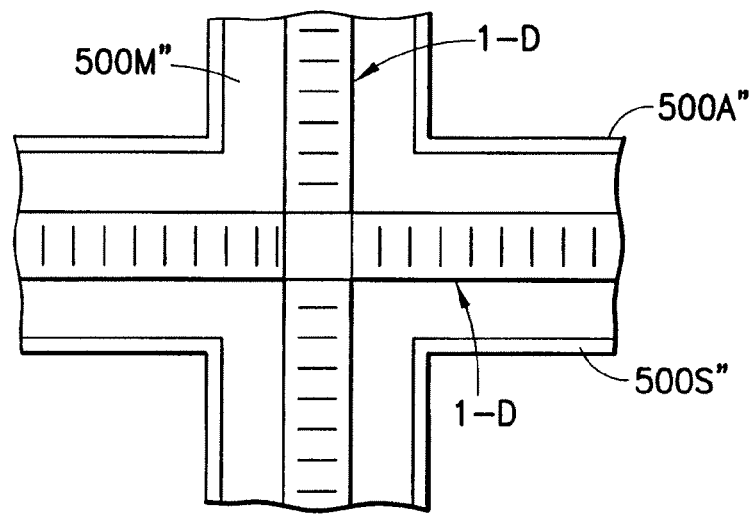
FIG. 21 is a schematic partial plan view of another portion of the transport system in accordance with another exemplary embodiment.
Figure 22:
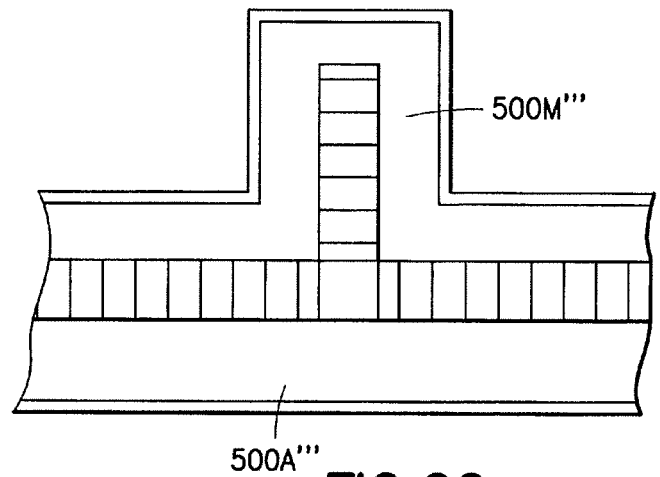
FIGS. 22-24 are other schematic partial plan views of portions of the transport system in accordance with other exemplary embodiments.
Figure 23:
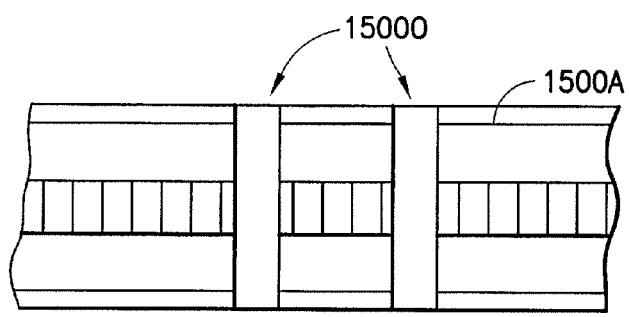
Figure 23A:
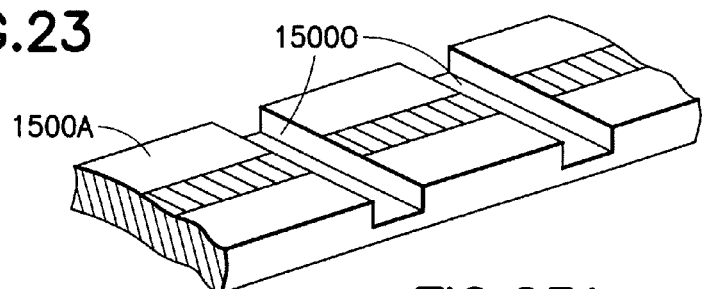
Figure 24:
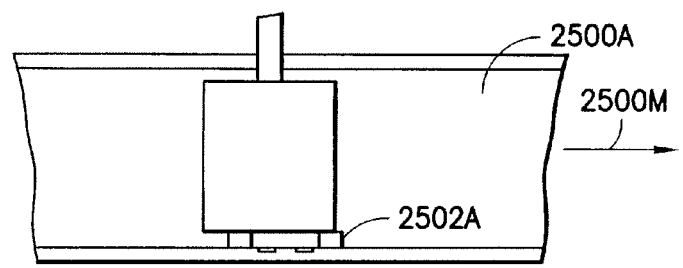

FIG. 21 shows an intersection, or turn segment of the conveyor transport system in accordance with another exemplary embodiment. In the exemplary embodiment shown, the transport segment 500A" defines multiple travel lanes 500M", 500S" that intersect. The travel lanes are generally similar to lane 500M (see FIG. 20A). In the exemplary embodiment, the transport vehicle may traverse a given lane 500S", 500M" until generally aligned with the intersecting lane. When aligned, the 1-D motor of the desired lane commences to move the transport along the intersecting lane. In alternate embodiments, the intersection may not be oriented at 90°. FIG. 20C shows the bottom of the carrier 1200 and the reactive elements therein. As may be realized the reactive elements may be arranged to coincide with the orientation of the respective forcer sections at the intersection (see for example FIG. 21). This allows the carrier to change tracks at the intersection substantially without stoppage. FIG. 20D shows the reactive elements 1202FA positioned on a pivotal section of a carrier 1200A that may be rotated to desired position in accordance with another exemplary embodiment. FIG. 22 shows a track segment 500H'" with a beside track storage location 500S'", generally similar to the intersection shown in FIG. 21. FIGS. 23-23A show track segments 500, with cutouts or openings 1500O for lift arms of a carrier lift or shuttle, (not shown) as described further below. In the exemplary embodiment, the openings 1500O allow side access to the carrier for a bottom pick of the carrier from the conveyor track. FIG. 24 shows a track segment 2500A with the forcer (such as a linear motor) 2502A located offset from carrier/track centerline indicated by arrow 2500M.

FIGS. 25A-25B show a linear motor conveyor 3500 (having grounded forcer segments and reaction elements embedded within the carrier 3200) for transporting substrates within a semiconductor FAB. In the exemplary embodiment shown, the conveyor 3500 may be inverted (e.g. carrier is suspended from and is located below conveyor), as shown such that the carrier is accessible from directly below. The conveyor 3500 may otherwise be similar to transport system segments 500A, 500A", 500A'" described previously. In the exemplary embodiment, a magnetic retention forcer 3502 may be employed to maintain the coupling between the conveyor 3500 and carrier 3200. This force may arise from the linear motor coils (e.g. in a linear synchronous design) and/or via separate electromagnets and/or permanent magnets (not shown) provided specifically for that purpose. Coupling and decoupling of the carrier to the conveyor is rapid and may be achieved without moving parts (e.g., an electromagnetic switch). Failsafe operation may be assured via flux path and/or passive mechanical retention features between carrier and conveyor.

In the exemplary embodiment intersections and branch points (i.e., merge-diverge locations similar for example to segment 500B in FIG. 20) may be achieved with coil switching. In alternate embodiments, turntables or other routing devices, may be used to transfer carriers between travel paths of the conveyor 3200.

In the exemplary embodiment the carrier 3200 may be arranged such that the reaction elements are on the top, and the substrates are accessed from the bottom of the carrier. In the exemplary embodiment, carrier 3200 may have a magnetic platen located to cooperate with the forcer of conveyor 3500. The carrier platen =, or platen section may include rollers, bearing or other motive support surfaces (e.g. reaction surface for air bearings in the conveyor). The platen may also include an electromagnetic coupling allowing the container portion of the carrier to decouple from the platen portion that may remain connected to the conveyor when the workpiece container portion is loaded on a processing tool 3030.

In the exemplary embodiment, to load a tool, the conveyor 3200 positions a carrier at the tool loadport, and for example a dedicated vertical transfer mechanism 3040 may be used (see also FIGS. 26A-26B) to lower the carrier from the conveyor elevation to the (controlled environment) loading interface 3032 of the tool 3030. The vertical transfer device may also be used as an indexer, thereby positioning the wafers for access by a wafer-handling robot. A suitable example of a vertical transfer device is described in U.S. patent application Ser. No. 11/210,918, filed Aug. 25, 2005 and previously incorporated by reference herein.

In alternate embodiments, the conveyor may be a powered-wheel accumulating conveyor positioned in an inverted arrangement and having a suitable magnetic attractive force to hold the carrier on the conveyor wheels. In other alternate embodiments, the general arrangement may be inverted such that the conveyor is below the loadport, the carrier has reaction features on the top.

Figure 26A:
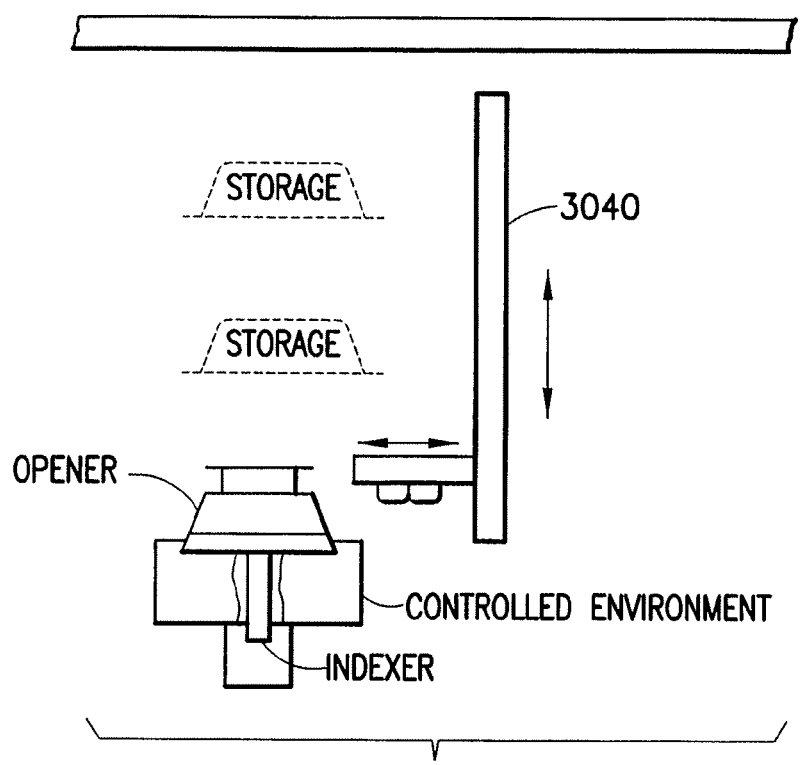
FIGS. 26A-26B respectively show different schematic elevation views of a transfer interface system for transferring carriers between transport system and tool in accordance with another exemplary embodiment.
Figure 26B:
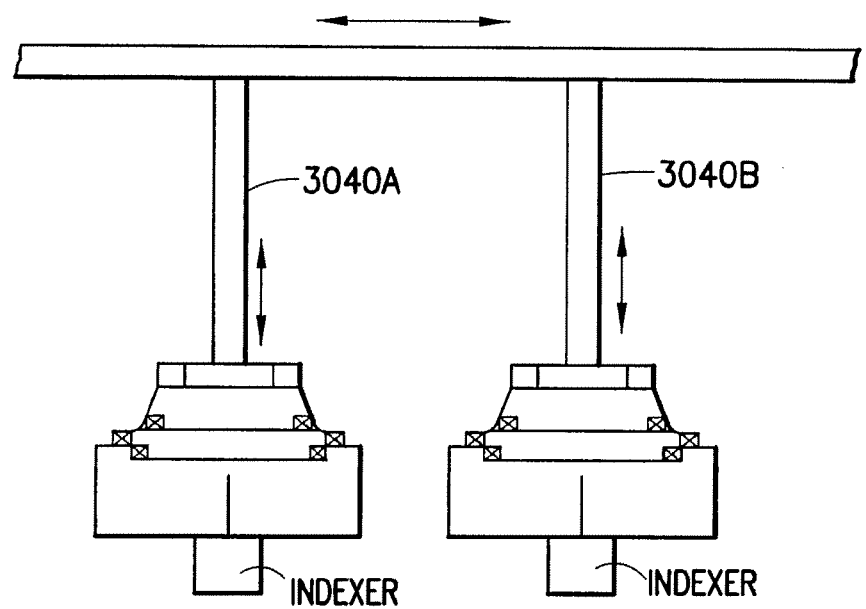

FIGS. 26A-26B show other examples of direct lower/lift carriers from transport system to load port/tool interface. In the exemplary embodiments shown in FIGS. 26A-26B, the carriers may have a reaction platen that may be integral to the carrier. In other embodiments the platen, as noted before, may be detachable from the carrier, for example remaining on/coupled to the conveyor when the carrier is removed. In such a case, each platen in the transport system corresponds in a substantially 1:1 relationship to the carriers in the FAB.

Figure 27:
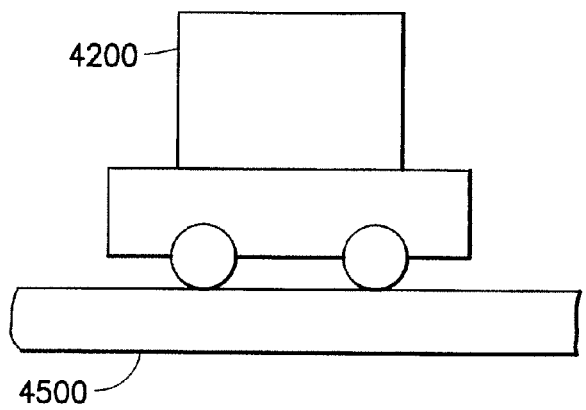
FIG. 27 is a schematic partial elevation view of a transport system in accordance with another exemplary embodiment and FIGS. 27A-27B are other schematic partial elevations of the transport system in different positions.

FIG. 27 illustrates a carrier 4200 having a conveyor vehicle hybrid configuration in accordance with another exemplary embodiment. Carrier vehicle(s) 4200 may be provided for automated conveyance of payloads (such as carriers containing semiconductor substrates). The vehicles may carry stored energy for self-propulsion, a steering system, at least one motor-powered drive wheel, sensors for odometry and obstacle detection, and associated control electronics. In addition the vehicles are outfitted with one or more reaction elements (similar to magnetic platens described before) that can cooperate with stationary linear motor forcer segments of a conveyor 4500, similar to conveyor system 500 (see also FIG. 20).

Figure 27A:
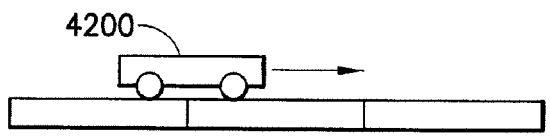
Figure 27B:
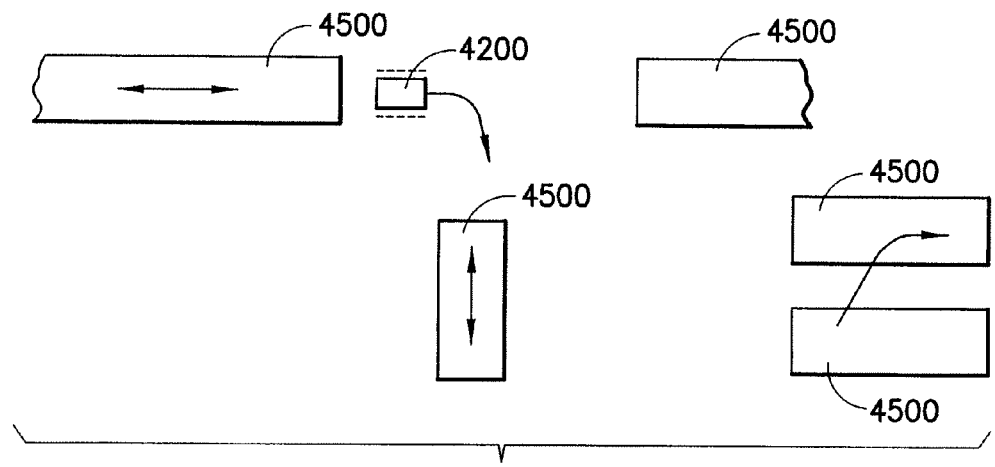

In the exemplary embodiment, when a vehicle(s) 4200 is traveling along the path (similar to paths 500M, 500J) defined by one or more forcer segments, the drive motor may be disconnected from the drive wheel(s), and the vehicle be passively urged along the path via electromagnetic coupling with the reaction elements in the conveyor 4500. If the stored energy device (e.g. batteries, ultracapacitors, flywheel, etc.) within the vehicle needs to recharge, the motion of the traction wheel(s) along the guideway may be used to convert energy from the linear motor to the vehicle storage. In the case of electrical energy storage, this may be accomplished by re-connecting the vehicle drive motor to be used as a generator with suitable monitoring and conditioning electronics. Such "on-the-fly" charging has the benefit of simplicity and ruggedness, and such an arrangement affords significant flexibility and fault tolerance. For example, vehicle(s) 4200 may be capable of driving autonomously past failed conveyor segments, around obstacles or between work areas not serviced by a conveyor (see FIGS. 27A, 27B). The number and length of conveyor forcer segments may be tailored to an operating scheme such as a conveyor for interbay transport, and using autonomous vehicle motion with the bay for example. Self-directed steering may be used for flexible route selection. Self-directed cornering could be used to eliminate curved forcer segments. High-speed travel may be effected along conveyor runs and, if desired, separated from operators by safety barriers. Conveyor sections may be used for long runs, such as links to adjacent FABs. Conveyors may be used for grade changes, mitigating the difficulties encountered by vehicles using exclusively stored energy.

Figure 28:
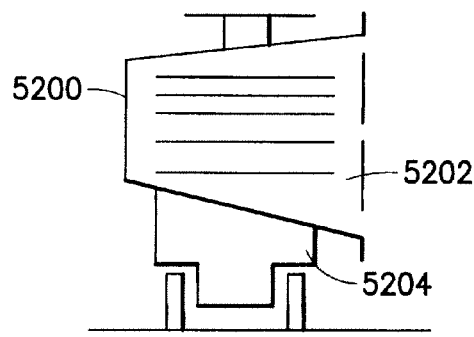
FIG. 28 is another schematic elevation view of a transport system in accordance with another exemplary embodiment.

FIG. 28 shows another example of an integrated carrier and transport vehicle. In contrast to conventional vehicle-based semiconductor automation, in which vehicles are dispatched to transport workpiece carriers, within a FAB, in the exemplary embodiment each carrier 5200 is a vehicle. The integrated carrier/vehicle 5200 in the exemplary embodiment may be similar to vehicle 4200 described before. In alternate embodiments, the carrier vehicle may have any desired vehicle features. In the exemplary embodiment vehicle 5200 may include integral carrier 5202 and vehicle 5204 portions. The carrier 5202 is shown as front/side opening in FIG. 28 for example purposes. In alternate embodiments, the carrier may be top opening or may have any other suitable workpiece transfer opening. The vehicle may drive directly to the loadport where work pieces are to be transferred, or may be engaged by another automation component such as a tool buffer. Substantially permanently fixing the carrier 5202 and vehicle 5204 eliminates the time waiting for a free vehicle to be dispatched when a lot transfer is desired, as well as the associated deliver time variance. Further, the carrier vehicle 5200 eliminates "empty-car" moves and hence may reduce the total traffic on the transport network improving the system capacity. In alternate embodiments, the carrier and vehicle may have a coupling for detaching carrier from vehicle. Though vehicles in the system may be apportioned to carriers in a 1:1 relationship to eliminate delays in carrier transport awaiting for vehicles, system knowledge in a suitable controller may be used to allow separation in limited instances (e.g. repair/maintenance or either vehicle or workpiece carrier sections). Otherwise, the carrier and vehicle remain an integral unit during transport or when engaged to a tool loading station or other automation component of the FAB.

Figure 29C:
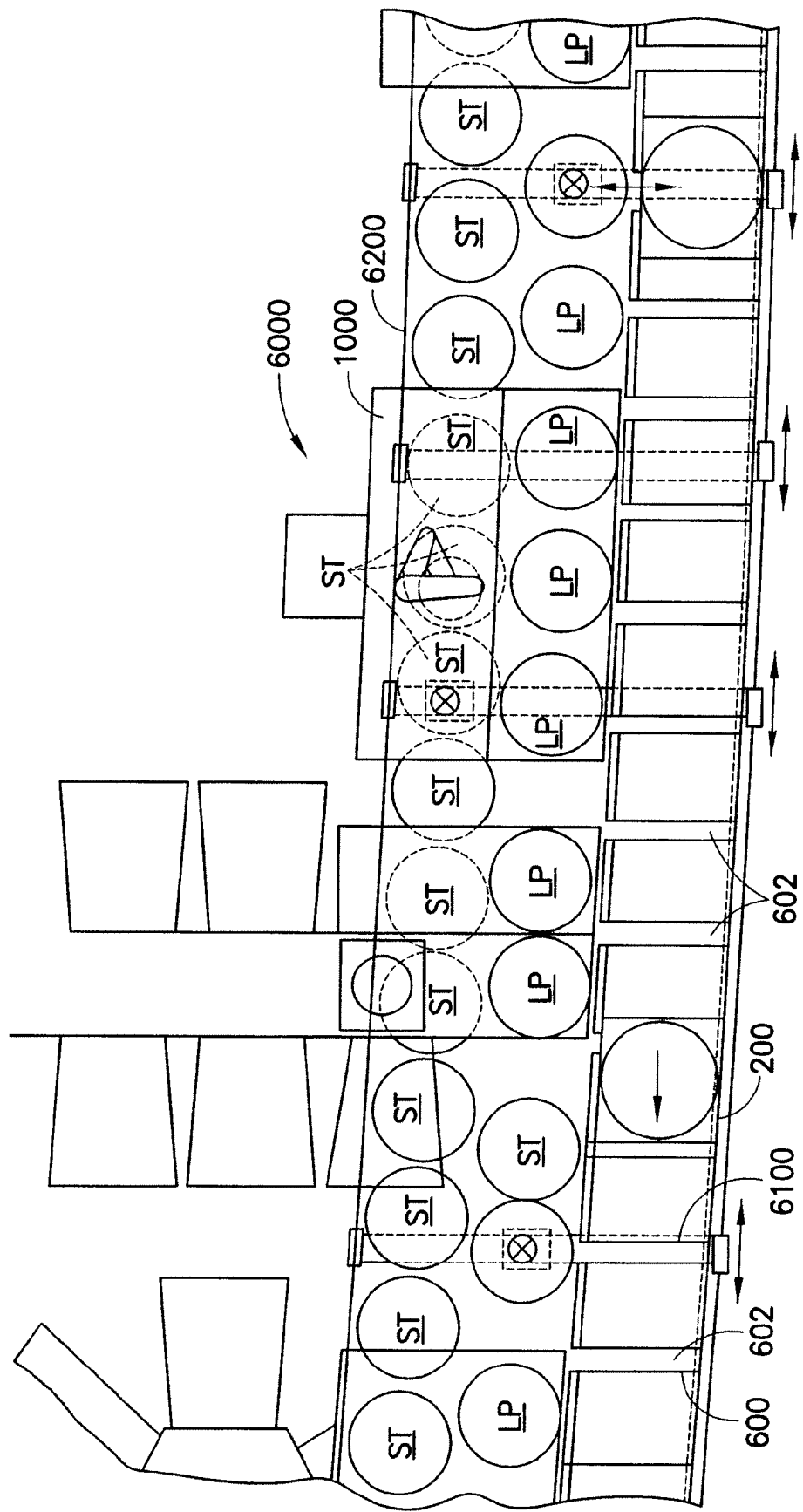
FIG. 29C is a schematic plan view of a transport system and processing tools in accordance with another exemplary embodiment.
Figure 30:
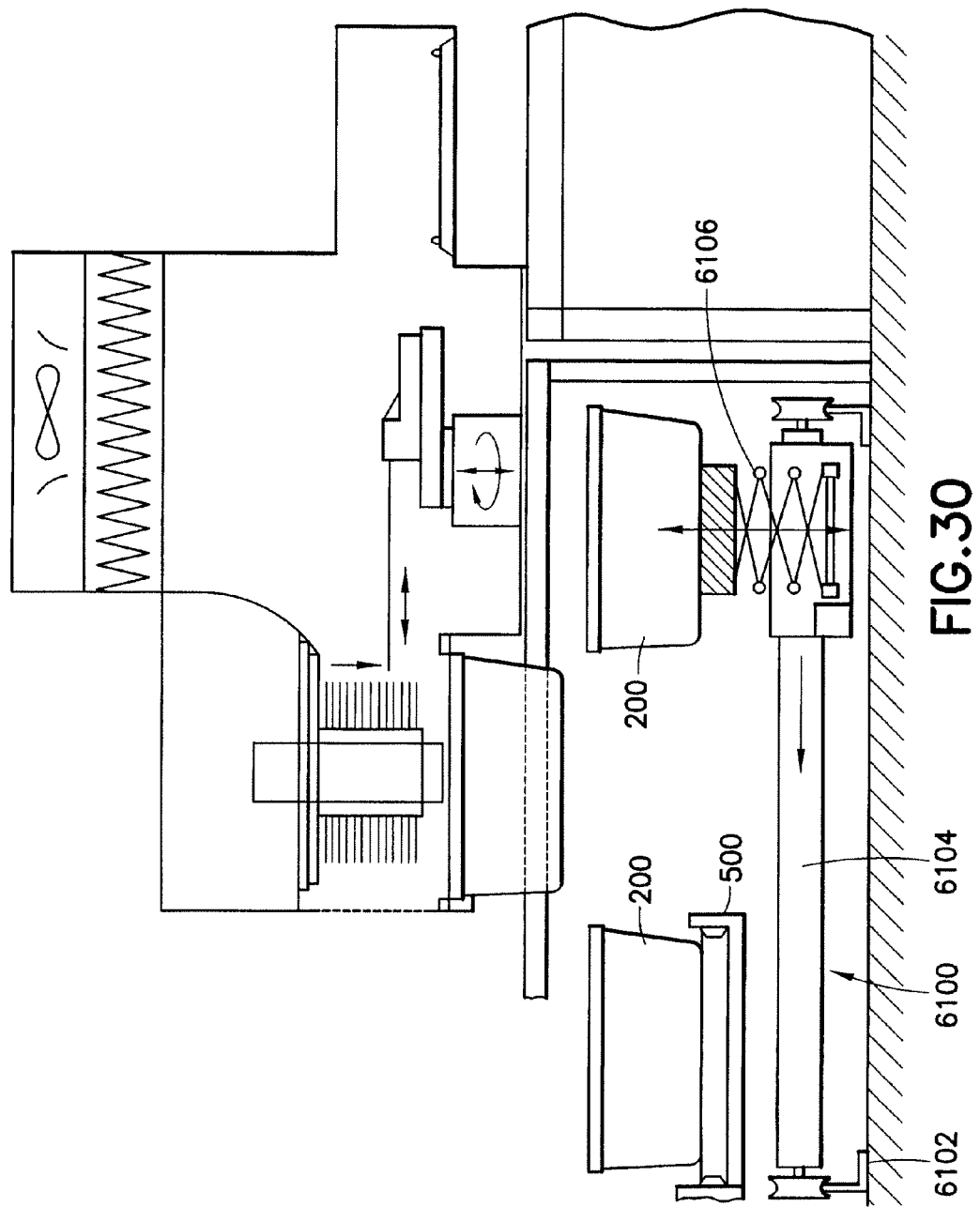
FIG. 30 is a schematic partial elevation of the transport system and processing tools in FIG. 29C.
Figure 31:
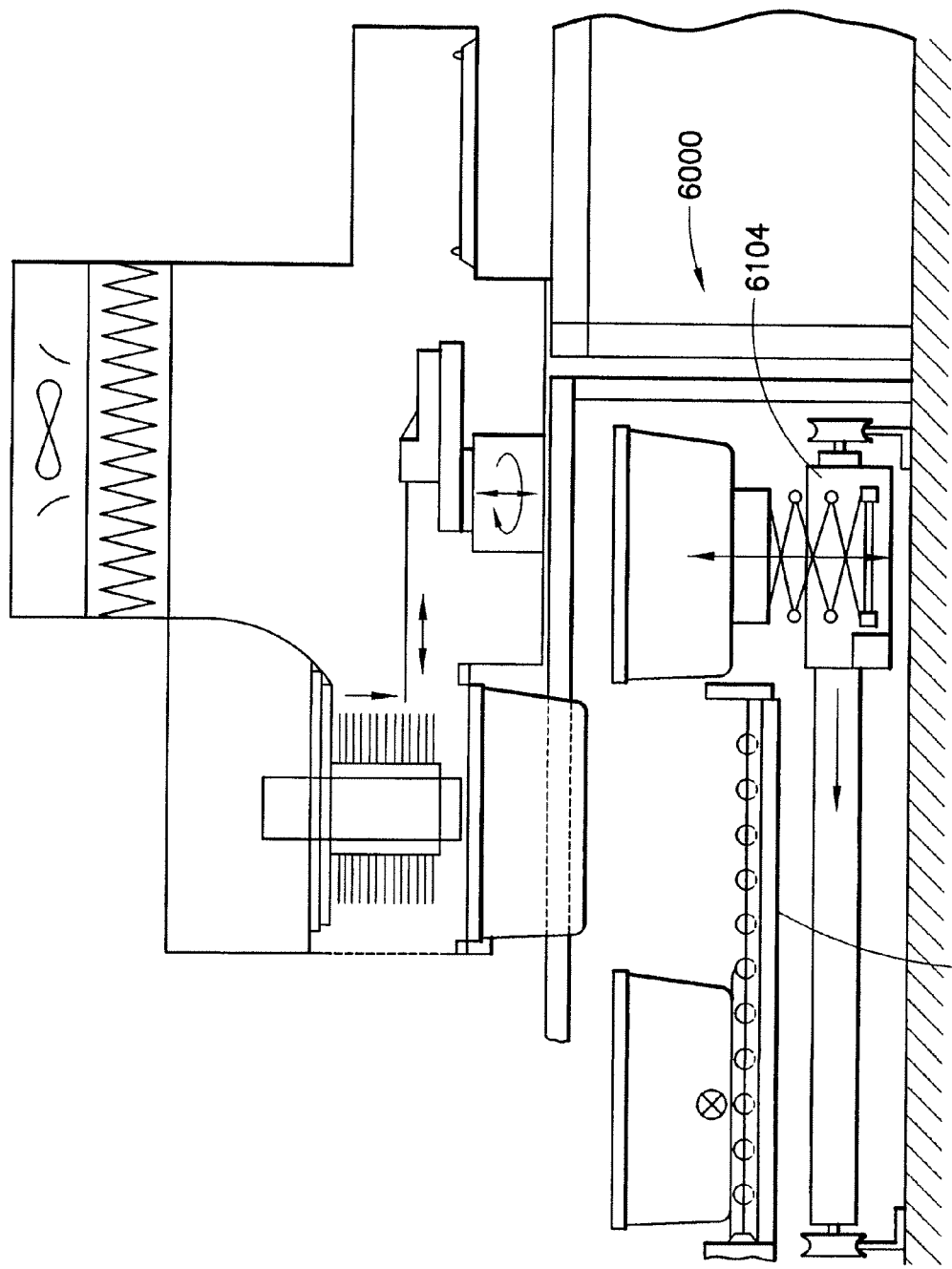
FIG. 31 is another schematic partial elevation of the transport system.
Figure 32:
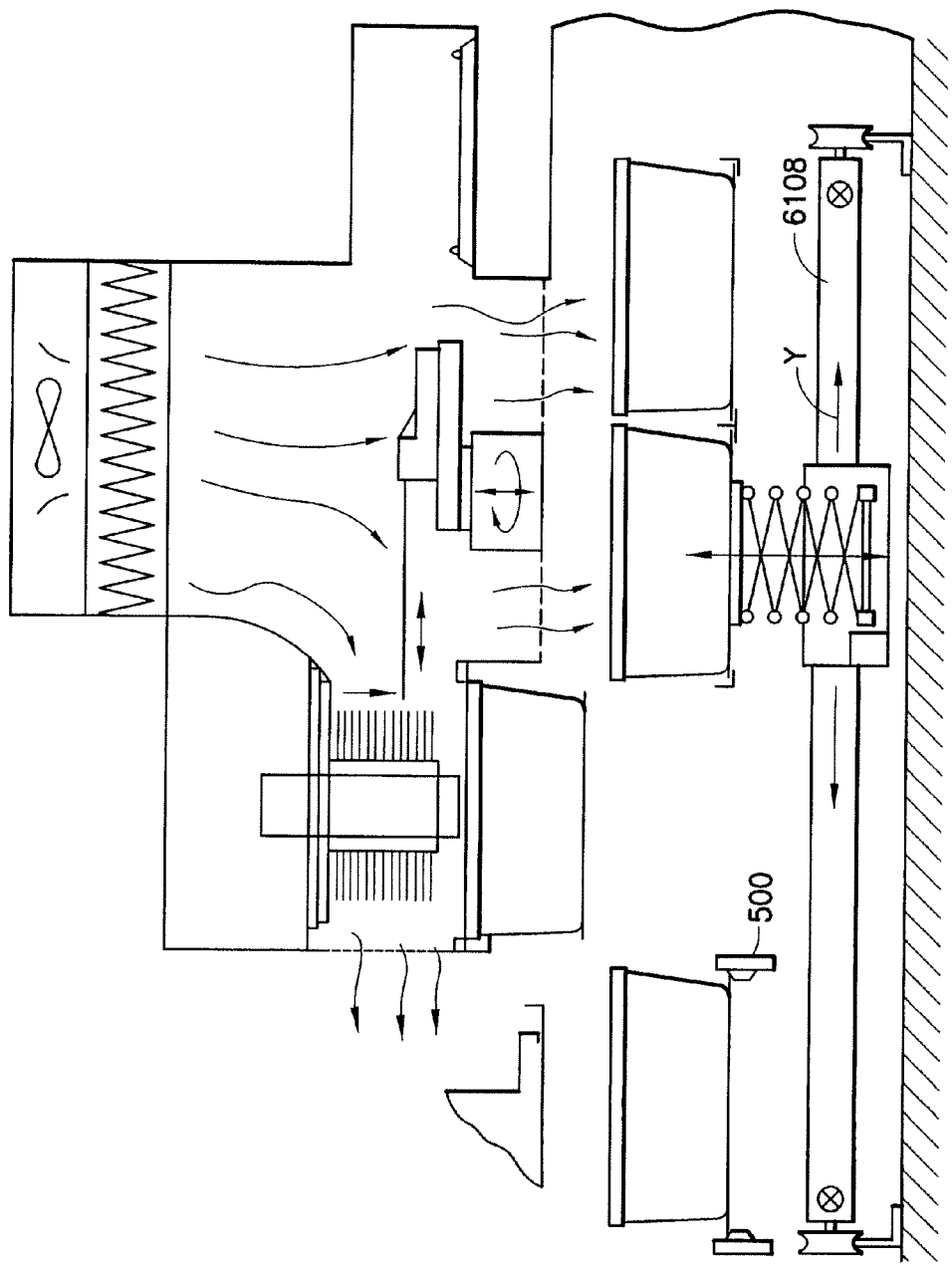
FIG. 32 is another schematic partial elevation of the transport system in accordance with another exemplary embodiment.
Figure 33:
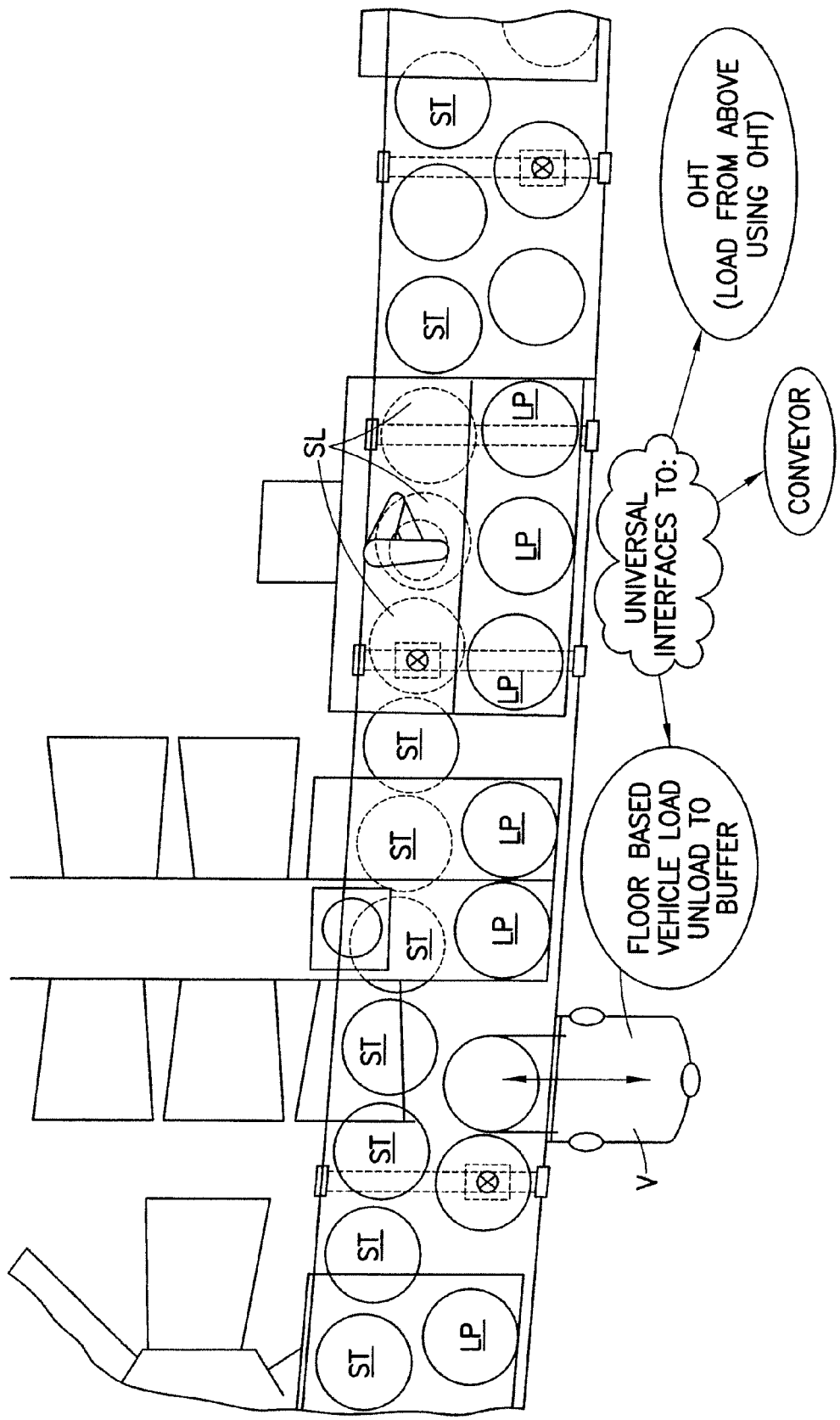
FIGS. 33-34 are respectively schematic plan and elevation views of another transport system in accordance with other exemplary embodiments.
Figure 34:
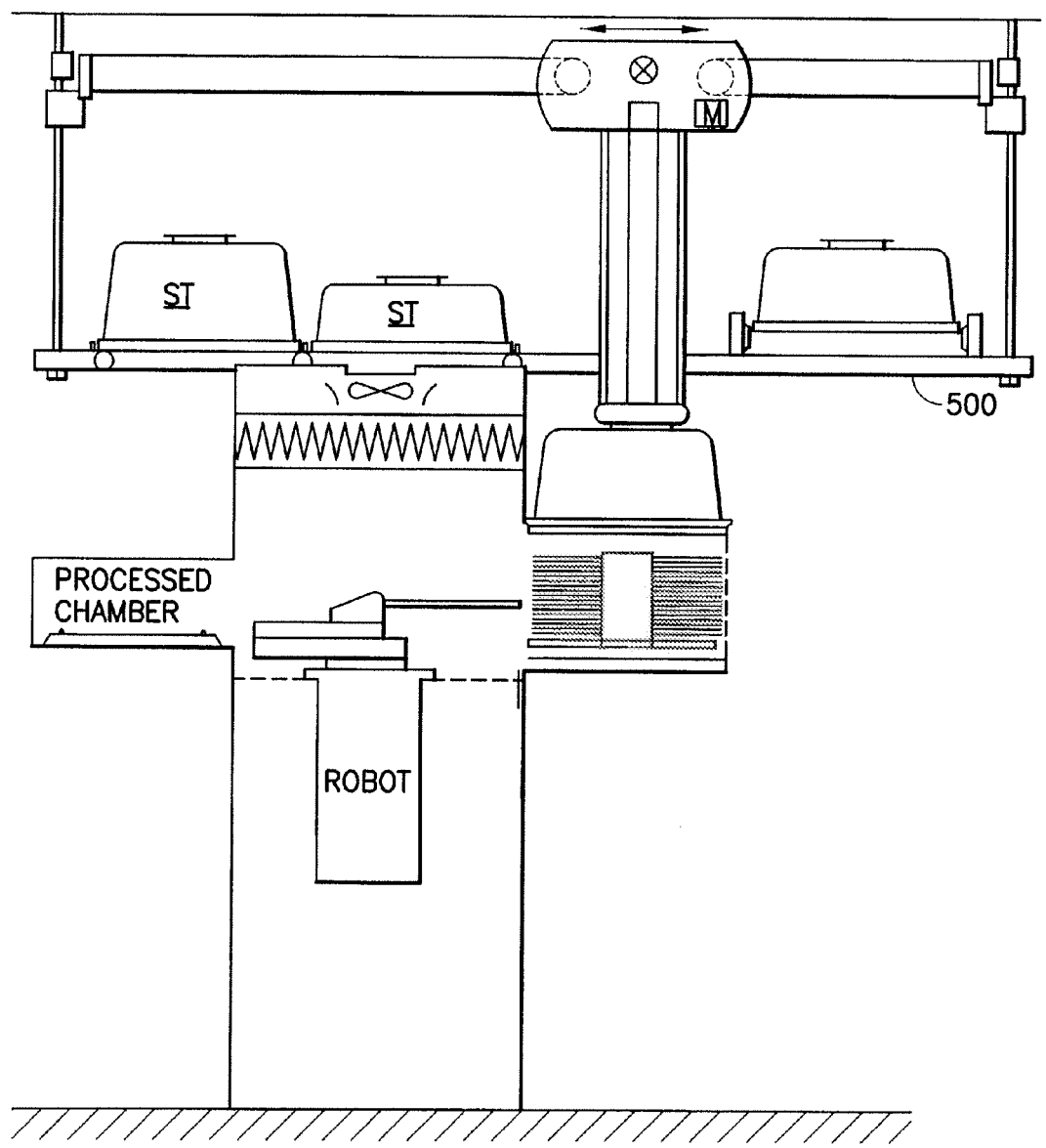

FIG. 29C shows a plan view of a horizontally arrayed buffering system 6000 that may interface between a conveyor system 500 (or any other desired carrier transport system) and tool stations 1000 in accordance with another exemplary embodiment. The buffering system may be located under tool stations or portions thereof or above the tool stations. The buffering system may be positioned away (i.e. below or above) from operator access ways. FIG. 30 is an elevation view of the buffering system. FIGS. 29C-30 show the buffering system located on one side of conveyor 500 for example purposes. The buffering system may be extended to cover as large a portion of the FAB floor as desired. In the exemplary embodiment shown, operator walkways may be elevated above the buffering system. Similarly, the buffering system may be extended anywhere in the FAB overhead. As seen in FIGS. 29C-30, in the exemplary embodiment the buffering system 6000 may include a shuttle system 6100 (which may have suitable carrier lift or indexer) capable of at least 3-D movement and an array of buffer stations ST. The shuttle system may generally include guide system (e.g. rails) 6102 for one or more shuttle(s) 6104 capable of at least 2-D traverse over the guide system. The arrangement of the shuttle system illustrated in FIGS. 29C-30 is merely exemplary and in alternate embodiments the shuttle system may have any other desired arrangement. In the exemplary embodiment, the shuttle system shuttles or interfaces between the conveyor 500, buffer stations ST and tool loading stations LP (see FIG. 29C). The shuttle(s) 6102 are capable of traversing between horizontally disposed conveyor 500 (for example via an access lane 602 between the segments 600 of the conveyor) and buffer storage ST or loading locations LP on the tool stations to shuttle carriers 200 therebetween. As seen best in FIG. 30, in the exemplary embodiment, the shuttle(s) 6104 may include an indexer 6106 for picking/placing the carrier on the conveyor 600, or buffer stations ST or tool loadport LP. The buffering system may be configured in modular form allow the system to be easily expanded or reduced. For example, each module may have corresponding storage location(s) ST and shuttle rails and coupling joints for joining to other installed modules of the buffering system. In alternate embodiments, the system may have buffering station modules (with one or more integral buffering stations) and shuttle rail modules allowing modular installation of the shuttle rails. As seen in FIG. 29C, the access lane(s) 60L of the conveyor 500 may have shuttle access ways allowing the shuttle indexer to access the carrier through the conveyor lane. FIG. 31 shows elevation of a buffering system 6000 communicating with the merge/diverse lane of the conveyor 500. In the exemplary embodiment, the buffering system shuttle 6104 may access carriers directed onto the access lane of the conveyors. Stops (or lack of accessways similar to lanes 602 in FIG. 29C) may limit the shuttle from accessing or interfering with the travel lane of the conveyor. FIG. 32 is yet another elevation showing multiple rows of buffering stations. The buffering system may have any desired number of buffering stations in any desired number of rows. Shuttle traverse (in the direction indicated by arrow Y in FIG. 32) may be adjusted as desired by modular replacement of traverse guide 61087. In other alternate embodiments, the buffering stations may be arrayed in multiple horizontal planes or levels (i.e. two or more levels that may be vertically separated (to allow carrier height pass through between levers). Multilevel buffering may be used with reduced capacity carriers. FIG. 33 shows another plan view of a buffering system with an interface to a guided vehicle carrier V. FIG. 34 shows an elevation view of an overhead buffering system 7000 otherwise similar to the under tool buffering system 6000 described before. The overhead buffering system 7000 may be used in conjunction with the under tool buffering system (similar to system 6000). The overhead buffering system is shown interfacing with an overhead conveyor 500. In alternate embodiments, the overhead system may interface with a floor conveyor system or floor based vehicles. Suitable control interlocks (e.g. hard) may be provided to prevent horizontal traverse of shuttle with lowered payload that may impinge walkway vertical clearances. Top shields over the walkway may be used for preventing suspended loads from crossing through walkway space.

Figure 35:
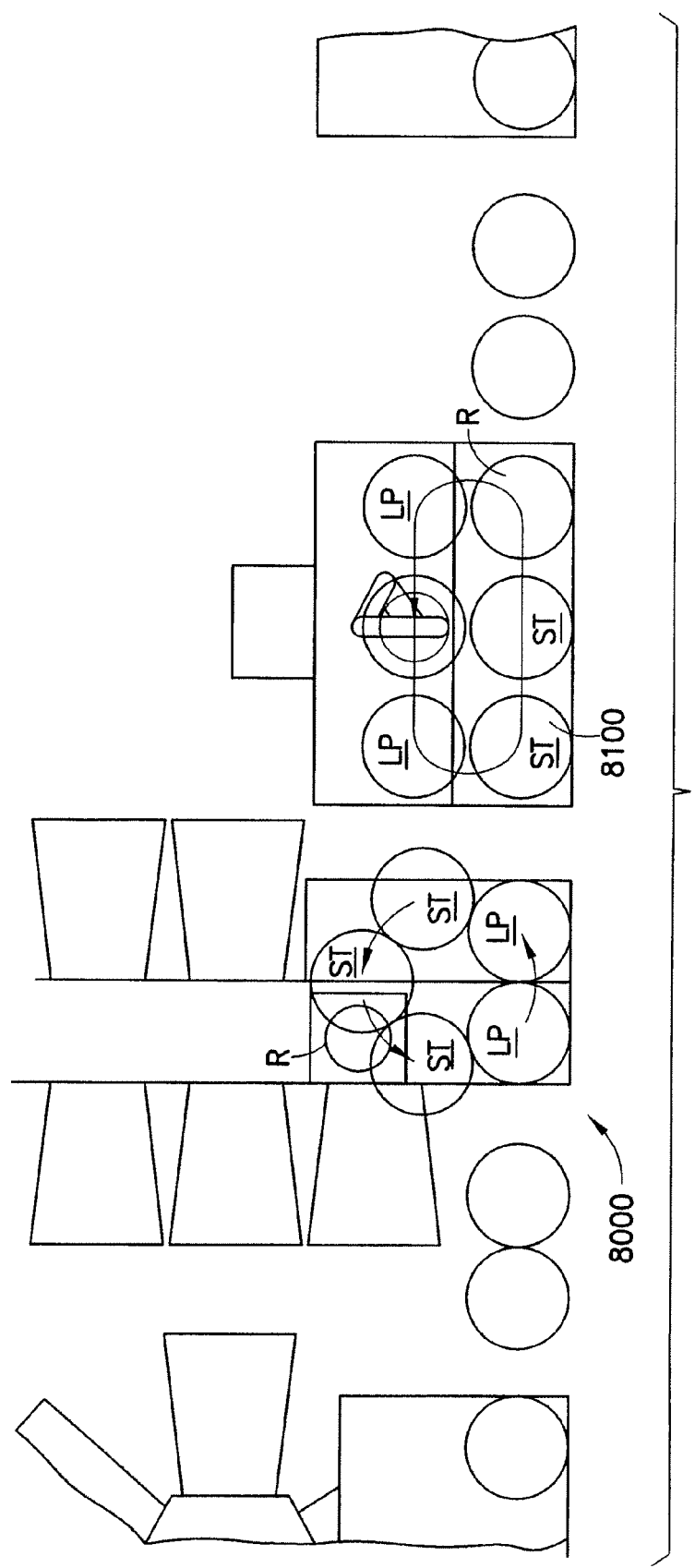
FIG. 35 is yet another schematic plan view of a transport system in accordance with another exemplary embodiment.

FIG. 35 shows a looped buffering system 8000. The buffering stations ST of the system may be movable, mounted on a track 8100 (in the exemplary embodiment shown as being closed looped) that moves the buffer stations ST between loading position(s) R in which carriers may be loaded into the buffer stations ST (for example with overhead loading) and loading station(s) LP of a tool interface. The tool interface may have an indexer for loading the carrier to the tool station.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

The invention claimed is:

1. A semiconductor workpiece processing system comprising:
    at least one processing tool for processing semiconductor workpieces;
    a primary transport system having one or more constant velocity transport loops arranged for independently motive vehicles to transport semiconductor workpieces along the primary transport system at a constant speed;
    a secondary transport system having one or more constant speed transport loops arranged for the vehicles to transport semiconductor workpieces along the secondary transport system at a constant speed, the secondary transport system being connected to the primary transport system through queue sections wherein, the queue sections are configured to allow the movement of semiconductor workpieces between the primary transport system and secondary transport system without disrupting the flow of either the primary or secondary transport systems wherein the primary transport system, secondary transport system and queue sections are configured so that a vehicle is capable of crossing between the primary and secondary transport systems via the queue sections substantially without affecting the speed of any other vehicle moving along the constant speed transport loops of either the primary or secondary transport systems;
    a control unit coupled to the primary and secondary transport systems, the control unit being configured to effect movement of the vehicles along the primary and secondary transport systems; and
    one or more interfaces connected to the one or more transport loops of the secondary transport system through interface shunts for interfacing with the at least one processing tool, wherein the interface shunts are configured to allow the movement of semiconductor workpieces between the one or more transport loops of the secondary transport system and the one or more interfaces without disrupting a flow of the secondary transport system;
    wherein the flow of semiconductor workpieces along the one or more constant speed transport loops of the primary and secondary transport systems is continuous.

2. The system of claim 1 wherein the one or more constant speed transport loops of the primary transport system comprise at least two constant speed transport loops that are connected to each other through the one or more constant speed transport loops of the secondary transport system.

3. The system of claim 1 wherein the one or more constant speed transport loops of the primary transport system comprise at least two constant speed transport loops that are connected to each other through one or more cross shunts.

4. The system of claim 1 wherein the one or more constant speed transport loops of the secondary transport system comprise at least two constant speed transport loops that are connected to each other through one or more cross shunts.

5. The system of claim 1 wherein the at least one of the one or more constant speed transport loops of the primary transport system comprise at least two constant speed transport loops that where one of the at least two constant speed transport loops are connected to another of the at least two constant speed transport loops of the primary transport system through queue sections.

6. The system of claim 1 wherein the vehicles are configured for the transportation of containers for holding at least one semiconductor workpiece therein for transport to and from the processing tool.

7. The system of claim 1 wherein the primary and secondary transport systems are configured to allow a workpiece container designated to be transferred to a queue section or an interface shunt to continue traveling along the primary or secondary system until the queue section or interface shunt becomes available.

8. The system of claim 1 wherein the primary transport system, the secondary transport system, the queue sections and the interface shunts each comprise a set of parallel tracks wherein each track of the set of parallel tracks is configured to provide transportation of workpiece carriers in opposite directions from each other.

* * * * *